(12) United States Patent
Todorov et al.

(10) Patent No.: US 10,109,773 B2
(45) Date of Patent: Oct. 23, 2018

(54) LIGHT-EMITTING DEVICES HAVING CLOSELY-SPACED BROAD-SPECTRUM AND NARROW-SPECTRUM LUMINESCENT MATERIALS AND RELATED METHODS

(71) Applicant: Cree, Inc., Durham, NC (US)

(72) Inventors: Iliya Todorov, Durham, NC (US); David Clatterbuck, Raleigh, NC (US); Jasper Cabalu, Apex, NC (US); Brian Collins, Holly Springs, NC (US); Michael John Bergmann, Raleigh, NC (US); Florin Tudorica, Chapel Hill, NC (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 15/832,848

(22) Filed: Dec. 6, 2017

(65) Prior Publication Data

US 2018/0108816 A1    Apr. 19, 2018

Related U.S. Application Data

(62) Division of application No. 15/184,104, filed on Jun. 16, 2016, now Pat. No. 9,871,173.

(Continued)

(51) Int. Cl.
*H01L 33/50* (2010.01)
*C09K 11/77* (2006.01)
*C09K 11/61* (2006.01)

(52) U.S. Cl.
CPC .......... *H01L 33/504* (2013.01); *H01L 33/507* (2013.01); *C09K 11/617* (2013.01);
(Continued)

(58) Field of Classification Search
CPC ... H01L 33/504; H01L 33/507; H01L 33/502; C09K 11/617; C09K 11/7731
See application file for complete search history.

(56) References Cited

U.S. PATENT DOCUMENTS

| 2,462,517 A | 2/1949 | Leverenz |
| 3,082,061 A | 3/1963 | Barry et al. |

(Continued)

FOREIGN PATENT DOCUMENTS

| GB | 1 360 690 | 7/1974 |
| WO | WO 00/22065 | 4/2000 |

(Continued)

OTHER PUBLICATIONS

Chowdhury et al., Red Line Emitting Phosphors—Enabling High Perfrmoance LEDs and LED systems (10 pages), presentation at The LED Show, Feb. 24-26, 2015 (Admitted Prior Art).

(Continued)

*Primary Examiner* — A. Sefer
(74) *Attorney, Agent, or Firm* — Myers Bigel, P.A.

(57) ABSTRACT

A semiconductor light emitting device includes an LED and an associated recipient luminophoric medium that includes respective first through fourth luminescent materials that down-convert respective first through fourth portions of the radiation emitted by the LED to radiation having respective first through fourth peak wavelengths. The first peak wavelength is in the green color range and the second through fourth peak wavelengths are in the red color range. The second and third luminescent materials each emit light having a full-width half maximum bandwidth of at least 70 nanometers, while the fourth luminescent material emits light having a full-width half maximum bandwidth of less than 60 nanometers. Embodiments that only include three luminescent materials are also disclosed.

20 Claims, 16 Drawing Sheets

Related U.S. Application Data

(60) Provisional application No. 62/181,249, filed on Jun. 18, 2015, provisional application No. 62/222,382, filed on Sep. 23, 2015.

(52) U.S. Cl.
CPC ........ *C09K 11/7731* (2013.01); *H01L 33/502* (2013.01); *H01L 2224/48091* (2013.01); *H01L 2224/8592* (2013.01); *H01L 2924/19107* (2013.01)

(56) References Cited

U.S. PATENT DOCUMENTS

| | | | |
|---|---|---|---|
| 3,575,876 A | 4/1971 | Piper | |
| 3,576,756 A | 4/1971 | Russo | |
| 3,619,265 A | 11/1971 | Hammond et al. | |
| 4,684,539 A | 8/1987 | Chenot et al. | |
| 4,829,188 A | 5/1989 | Shinomiya et al. | |
| 5,149,514 A | 9/1992 | Sanjurjo | |
| 5,626,957 A | 5/1997 | Benso et al. | |
| 6,039,894 A | 3/2000 | Sanjurjo et al. | |
| 6,242,043 B1 | 6/2001 | Lipp | |
| 6,346,326 B1 | 2/2002 | Yocom | |
| 6,466,135 B1 | 10/2002 | Srivastava et al. | |
| 6,504,179 B1 | 1/2003 | Ellens et al. | |
| 6,521,915 B2 | 2/2003 | Odaki et al. | |
| 6,600,175 B1 | 7/2003 | Baretz et al. | |
| 6,616,862 B2 | 9/2003 | Srivastava et al. | |
| 6,621,211 B1 | 9/2003 | Srivastava et al. | |
| 6,800,373 B2 | 10/2004 | Gorczyca | |
| 6,982,045 B2 | 1/2006 | Menkara et al. | |
| 7,224,000 B2 | 5/2007 | Aanegola et al. | |
| 7,241,400 B2 | 7/2007 | Furusawa et al. | |
| 7,400,085 B2 | 7/2008 | Hasegawa | |
| 7,453,195 B2 | 11/2008 | Radkov | |
| 7,497,973 B2 | 3/2009 | Radkov et al. | |
| 7,648,649 B2 | 1/2010 | Radkov et al. | |
| 7,800,121 B2 | 9/2010 | Aanegola et al. | |
| 8,057,706 B1 | 11/2011 | Setlur et al. | |
| 8,252,613 B1 | 8/2012 | Lyons et al. | |
| 8,491,816 B2 | 7/2013 | Hong et al. | |
| 8,643,038 B2 | 2/2014 | Collins et al. | |
| 8,710,487 B2 | 4/2014 | Lyons et al. | |
| 8,890,403 B2 | 11/2014 | Sakuta et al. | |
| 8,906,724 B2 | 12/2014 | Murphy et al. | |
| 8,921,875 B2 | 12/2014 | Letoquin et al. | |
| 8,974,696 B2 | 3/2015 | Kaneyoshi et al. | |
| 9,318,669 B2 | 4/2016 | Seibel, II et al. | |
| 2002/0110702 A1 | 8/2002 | Gingerich | |
| 2003/0155553 A1 | 8/2003 | Mortz et al. | |
| 2003/0173540 A1 | 9/2003 | Mortz et al. | |
| 2004/0218115 A1 | 11/2004 | Kawana et al. | |
| 2006/0169998 A1 | 8/2006 | Radkov et al. | |
| 2007/0054120 A1 | 3/2007 | Meyer et al. | |
| 2007/0114562 A1 | 5/2007 | Radkov et al. | |
| 2009/0231832 A1 | 9/2009 | Zukauskas et al. | |
| 2009/0261710 A1 | 10/2009 | Zukauskas et al. | |
| 2010/0103678 A1 | 4/2010 | Van De Ven et al. | |
| 2010/0123104 A1 | 5/2010 | Collins et al. | |
| 2010/0289044 A1 | 11/2010 | Krames et al. | |
| 2011/0037413 A1 | 2/2011 | Negley et al. | |
| 2011/0260192 A1 | 10/2011 | Kwak et al. | |
| 2012/0286304 A1 | 11/2012 | Letoquin et al. | |
| 2012/0306370 A1 | 12/2012 | Van De Ven et al. | |
| 2013/0094186 A1 | 4/2013 | Sun et al. | |
| 2013/0208442 A1 | 8/2013 | Reiherzer | |
| 2013/0264937 A1 | 10/2013 | Sakuta et al. | |
| 2013/0286304 A1 | 10/2013 | Lin et al. | |
| 2014/0313376 A1 | 10/2014 | Van Nieuwenhove et al. | |
| 2015/0060922 A1 | 3/2015 | Wilcox et al. | |
| 2015/0171284 A1 | 6/2015 | Bechtel et al. | |
| 2015/0295144 A1 | 10/2015 | Weiler et al. | |
| 2016/0115382 A1* | 4/2016 | Du | H01L 33/00 362/84 |
| 2016/0218254 A1 | 7/2016 | Jacobson et al. | |
| 2016/0244663 A1* | 8/2016 | Murphy | C09K 11/616 |
| 2016/0372638 A1 | 12/2016 | Todorov et al. | |

FOREIGN PATENT DOCUMENTS

| | | |
|---|---|---|
| WO | 2006/129228 | 12/2006 |
| WO | 2009/117287 | 9/2009 |

OTHER PUBLICATIONS

Anant Setlur, TriGain TM LED phosphor system using red Mn4+-doped complex fluorides (10 pages), GE Global Research 2015 DOE R&D workshop, Jan. 2015 (Admitted Prior Art).

Florencio Garcia-Santamaria, PFS, A Narrow Red LED Phosphor (K2SiT6:Mn4+) (22 pages), GE Global Phosphor Summit (Admitted Prior Art).

Bera et al. "Quantum Dots and Their Multimodal Applications: A Review" Materials 3:2260-2345 (2010).

Cao et al. "Preparation of Eu3+-Y3+ co-doping red-emitting phosphors for white-light emitting diodes (W-LEDs) application and investigation of their optical characteristics" Journal of Materials Science: Materials in Electronics 22:510-514 (2011).

Chen et al. "Greatly enhanced and controlled manganese photoluminescence in water-soluble ZnCdS:Mn/ZnS core/shell quantum dots" Chemical Physics Letters 488:73-76 (2010).

Chen et al. "Light Converting Inorganic Phosphors for White Light-Emitting Diodes" Materials 3:2172-2195 (2010).

Jacobsohn et al. "Preparation and Characterization of Rare Earth Doped Fluoride Nanoparticles" Materials 3:2053-2068 (2010).

Jean et al. "Y2O2S:Eu Red Phosphor Powders Coated with Silica" Journal of the American Ceramic Society 83(8):1928-1934 (2000).

Lehmann et al. "Synthesis of Eu3+-Doped Core and Core-Shell Nanoparticles and Direct Spectroscopic Identification of Dopant Sites at the Surface and in the Interior of the Particles" Journal of the American Chemical Society 126:14935-14942 (2004).

Li et al. "LaF3, CeF3, CeF3:Tb3+, and CeF3:Tb3+@LaF3 (Core-Shell) Nanoplates: Hydrothermal Synthesis and Luminescence Properties" The Journal of Physical Chemistry C 112:2904-2910 (2008).

Paulusz, A. G. "Efficient Mn(IV) Emission in Fluorine Coordination" Journal of the Electrochemical Society 120 (7):942-947 (1973).

Reiss et al. "Core/Shell Semiconductor Nanocrystals" Small 5(2):154-168 (2009).

Setlur, Anant A. "Phosphors for LED-based Solid-State Lighting" The Electrochemical Society Interface pp. 32-36 (2009).

* cited by examiner

|  |  |
|---|---|
| CCT: | 2728 |
| Duv: | 0.0012 |
| CRI Ra: | 82 |
| R9: | 34 |
| CQS Qa: | 81 |
| CQS Qf: | 79 |
| CQS Qg: | 101 |

|  |  |
|---|---|
| CCT: | 2704 |
| Duv: | -0.0008 |
| CRI Ra: | 81 |
| R9: | 15 |
| CQS Qa: | 82 |
| CQS Qf: | 82 |
| CQS Qg: | 95 |

|  |  |
|---|---|
| CCT: | 3026 |
| Duv: | -0.0006 |
| CRI Ra: | 92 |
| R9: | 96 |
| CQS Qa: | 92 |
| CQS Qf: | 89 |
| CQS Qg: | 108 |

|  |  |
|---|---|
| CCT: | 2717 |
| Duv: | 0.0008 |
| CRI Ra: | 90 |
| R9: | 94 |
| CQS Qa: | 87 |
| CQS Qf: | 84 |
| CQS Qg: | 109 |

LIGHT-EMITTING DEVICES HAVING CLOSELY-SPACED BROAD-SPECTRUM AND NARROW-SPECTRUM LUMINESCENT MATERIALS AND RELATED METHODS

CROSS-REFERENCE TO RELATED APPLICATIONS

The present application is a divisional application under 35 U.S.C. § 120 of U.S. patent application Ser. No. 15/184,104, filed Jun. 16, 2016, which in turn claims priority from U.S. Provisional Patent Application Ser. No. 62/222,382, filed Sep. 23, 2015 and from U.S. Provisional Patent Application Ser. No. 62/181,249, filed Jun. 18, 2015, the entire content of each of which is incorporated herein by reference.

BACKGROUND

The present invention relates to light emitting devices and, more particularly, to semiconductor light emitting devices that include recipient luminophoric mediums and to the luminescent materials that are included in such recipient luminophoric mediums.

A wide variety of light emitting devices are known in the art including, for example, incandescent light bulbs, fluorescent lights and semiconductor light emitting devices such as light emitting diodes ("LEDs"). LEDs generally include a series of semiconductor layers that may be epitaxially grown on a substrate such as, for example, a sapphire, silicon, silicon carbide, gallium nitride or gallium arsenide substrate. One or more semiconductor p-n junctions are formed in these epitaxial layers. When a sufficient voltage is applied across the p-n junction, electrons in the n-type semiconductor layers and holes in the p-type semiconductor layers flow toward the p-n junction. As the electrons and holes flow toward each other, some of the electrons will "collide" with corresponding holes and recombine. Each time this occurs, a photon of light is emitted, which is how LEDs generate light. The wavelength distribution of the light generated by an LED generally depends on the semiconductor materials used and the structure of the thin epitaxial layers that make up the "active region" of the device (i.e., the area where the electrons and holes recombine).

Most LEDs are nearly monochromatic light sources that appear to emit light having a single color. Thus, the spectral power distribution of the light emitted by most LEDs is tightly centered about a "peak" wavelength, which is the wavelength where the spectral power distribution or "emission spectrum" of the LED reaches its maximum as detected by a photo-detector. The "width" of the spectral power distribution of most LEDs is between about 10 nm and 30 nm, where the width is measured at half the maximum illumination on each side of the emission spectrum (this width is referred to as the full-width-half-maximum or "FWHM" width).

In order to use LEDs to generate white light, LED-based light emitting devices have been provided that include several LEDs that each emit a light of a different color. The different colored light emitted by the LEDs combine to produce a desired intensity and/or color of white light. For example, by simultaneously energizing red, green and blue LEDs, the resulting combined light may appear white, or nearly white, depending on, for example, the relative intensities, peak wavelengths and spectral power distributions of the source red, green and blue LEDs.

White light may also be produced by surrounding a single LED with one or more luminescent materials such as phosphors that convert some of the light emitted by the LED to light of one or more other colors. The combination of the light emitted by the single-color LED that is not converted by the luminescent material(s) and the light of other colors that are emitted by the luminescent material(s) may produce a white or near-white light.

As one example, a white LED lamp may be formed by coating a gallium nitride-based blue LED (i.e., an LED that emits light having a peak wavelength in the blue color range as defined herein) with a yellow luminescent material such as a cerium-doped yttrium aluminum garnet phosphor, which has the chemical formula $Y_3Al_5O_{12}$:Ce, and is commonly referred to as YAG:Ce. The blue LED emits light having an emission with a peak wavelength of, for example, about 460 nm. Some of blue light emitted by the LED passes between and/or through the YAG:Ce phosphor particles without being down-converted, while other of the blue light emitted by the LED is absorbed by the YAG:Ce phosphor, which becomes excited and emits yellow fluorescence with a peak wavelength of about 550 nm (i.e., the blue light is down-converted to yellow light). The combination of blue light and yellow light that is emitted by the coated LED may appear white to an observer. Such light is typically perceived as being cool white in color, as it is primarily comprises light on the lower half (shorter wavelength side) of the visible emission spectrum. To make the emitted white light appear more "warm" and/or exhibit better color rendering properties, red-light emitting luminescent materials such as $Eu^{2+}$ doped $CaAlSiN_3$ based phosphor particles may be added to the coating applied to the blue LED.

In general, luminescent materials may absorb light having first wavelengths and re-emit light having second wavelengths that are different from the first wavelengths. For example, "down-conversion" luminescent materials may absorb light having shorter wavelengths and re-emit light having longer wavelengths. Phosphors are the luminescent materials that are most widely used to convert a single-color (typically blue or violet) LED into a white light emitting device. However, it will be appreciated that other luminescent materials may be used that absorb light at one wavelength and re-emit light at a different wavelength in the visible spectrum such as nanophosphors, quantum dots, scintillators, day glow tapes, and inks that glow in the visible spectrum upon illumination with (e.g., ultraviolet) light.

A medium that includes one or more luminescent materials that is positioned to receive light that is emitted by an LED or other semiconductor light emitting device is referred to herein as a "recipient luminophoric medium." Exemplary recipient luminophoric mediums include layers having luminescent materials that are coated or sprayed directly onto a semiconductor light emitting device or on surfaces of the packaging thereof, and clear encapsulants (e.g., epoxy-based or silicone-based curable resin) that include luminescent materials that are arranged to partially or fully cover a semiconductor light emitting device. A recipient luminophoric medium may include one medium layer or the like in which one or more luminescent materials are mixed, multiple stacked layers or mediums, each of which may include one or more of the same or different luminescent materials, and/or multiple spaced apart layers or mediums, each of which may include the same or different luminescent materials.

SUMMARY

Pursuant to some embodiments of the present invention, semiconductor light emitting devices are provided that emit light in at least a blue color range, a green color range, a yellow color range and a red color range. These semiconductor light emitting devices include an LED and a recipient luminophoric medium that is configured to down-convert at least some of the light emitted by the LED. The recipient luminophoric medium includes at least (1) a first luminescent material that down-converts a first portion of the radiation emitted by the LED to radiation having a first peak wavelength that is in the green color range, (2) a second luminescent material that down-converts a second portion of the radiation emitted by the LED to radiation having a second peak wavelength that is in the red color range, the second luminescent material having a full-width half maximum bandwidth of at least 70 nanometers, (3) a third luminescent material that down-converts a third portion of the radiation emitted by the LED to radiation having a third peak wavelength that is in the red color range, the third luminescent material having a full-width half maximum bandwidth of at least 70 nanometers, and (4) a fourth luminescent material that down-converts a fourth portion of the radiation emitted by the LED to radiation having a fourth peak wavelength that is in the red color range, the fourth luminescent material having a full-width half maximum bandwidth of less than 60 nanometers.

In some embodiments, the fourth peak wavelength may be greater than the second peak wavelength and less than the third peak wavelength. The second peak wavelength may be within 40 nanometers, or within 30 nanometers, of the third peak wavelength.

In some embodiments, the combined spectral output of the second and third luminescent materials in response to the respective second and third portions of the radiation emitted by the LED may have a peak wavelength in the red color range that is within 20 nanometers of the fourth peak wavelength. The first luminescent material may have a full-width half maximum bandwidth of at least 70 nanometers.

In some embodiments, the fourth luminescent material may emit light in response to the fourth portion of the radiation emitted by the LED that has multiple distinct peaks in the red color range. In such embodiments, a first of the multiple distinct peaks may be at a wavelength that is less than a peak wavelength of a combined spectral output of the second and third luminescent materials in response to the respective second and third portions of the radiation emitted by the LED, and a second of the multiple distinct peaks may be at a wavelength that is greater than a peak wavelength of the combined spectral output of the second and third luminescent materials in response to the respective second and third portions of the radiation emitted by the LED. The first and second of the multiple distinct peaks may be the peaks having the highest spectral output.

In some embodiments, the first peak wavelength may be between 530 and 540 nanometers, the second peak wavelength may be between 620 and 640 nanometers and the third peak wavelength may be between 640 and 660 nanometers, and the fourth peak wavelength may be greater than the second peak wavelength and at least 10 nanometers less than the third peak wavelength. For example, the fourth peak wavelength may be between 630 and 640 nanometers.

In some embodiments, the first luminescent material may be a LuAG:Ce phosphor, the second luminescent material may be a $(Ca_{1-x}Sr_x)SiAlN_3:Eu^{2+}$ phosphor, and the third luminescent material may be a $(Ca_{1-x}Sr_x)SiAlN_3:Eu^{2+}$ phosphor having a higher calcium concentration than the second luminescent material. The fourth luminescent material may be an $A_2MF_6:Mn^{4+}$ phosphor where A is an Alkali metal and M is an element with a 4+ valence such as, for example, a $K_2SiF_6:Mn^{4+}$ phosphor.

A ratio of the first luminescent material to the second, third and fourth luminescent materials by weight may be between 2:1 and 3:1, and wherein a ratio of the second and third luminescent materials to the fourth luminescent material by weight may be between 1:3 and 1:6. A ratio of the second luminescent material to the third luminescent material by weight may be between 3:1 and 1:1.

Pursuant to further embodiments of the present invention, semiconductor light emitting devices are provided that emit light in at least a blue color range, a green color range, a yellow color range and a red color range. These semiconductor light emitting devices include an LED and a recipient luminophoric medium that is configured to down-convert at least some of the light emitted by the LED. The recipient luminophoric medium includes at least (1) a first luminescent material that down-converts a first portion of the radiation emitted by the LED to radiation having a first peak wavelength that is in the green color range or the yellow color range, (2) a second luminescent material that down-converts a second portion of the radiation emitted by the LED to radiation having a second peak wavelength that is in the red color range, (3) a third luminescent material that down-converts a third portion of the radiation emitted by the LED to radiation having a third peak wavelength that is in the red color range, and (4) a fourth luminescent material that down-converts a fourth portion of the radiation emitted by the LED to radiation having a fourth peak wavelength that is in the red color range. The fourth peak wavelength is greater than the second peak wavelength and less than the third peak wavelength, and an emission spectrum of the semiconductor light emitting device includes a first peak at the fourth peak wavelength that is at least 50% greater than any point in the emission spectrum in the yellow or green color ranges.

In some embodiments, the fourth luminescent material may emit light in response to the fourth portion of the radiation emitted by the LED that has multiple distinct peaks in the red color range. The second and third luminescent materials may each be a $(Ca_{1-x}Sr_x)SiAlN_3:Eu^{2+}$ phosphor that has a full-width half maximum bandwidth of at least 70 nanometers, and the fourth luminescent material may be a $K_2SiF_6:Mn^{4+}$ phosphor that has a full-width half maximum bandwidth that is less than 60 nanometers. The second peak wavelength may be within 30 nanometers of the third peak wavelength.

Pursuant to still further embodiments of the present invention, semiconductor light emitting devices are provided that emit light in at least a blue color range, a green color range, a yellow color range and a red color range. These semiconductor light emitting devices include an LED and a recipient luminophoric medium that is configured to down-convert at least some of the light emitted by the LED. The recipient luminophoric medium includes at least (1) a first luminescent material that down-converts a first portion of the radiation emitted by the LED to radiation having a first peak wavelength that is in the green color range, (2) a second broad-spectrum luminescent material that down-converts a second portion of the radiation emitted by the LED to radiation having a second peak wavelength that is in the red color range, (3) and a third $K_2SiF_6:Mn^{4+}$ phosphor that down-converts a third portion of the radiation emitted by the LED to radiation having a third peak wavelength that is in the red color range. The second peak wavelength is within twenty (20) nanometers of the third peak wavelength.

In some embodiments, the spectral output of the semiconductor light emitting device at the third peak wavelength may be at least 1.5 times the spectral output of the semiconductor light emitting device at the second peak wavelength. The third peak wavelength may be greater than the second peak wavelength. The $K_2SiF_6:Mn^{4+}$ phosphor may have multiple distinct peaks, and the two of the multiple distinct peaks having the highest spectral output have peak wavelengths may be on either side of the second peak wavelength.

Pursuant to still further embodiments of the present invention, methods of manufacturing a semiconductor light emitting device are provided in which a narrow-spectrum phosphor is synthesized by (1) dissolving $MO_2$ powder in a first hydrofluoric acid (HF) solution to provide an $MO_2$+HF solution, where M is one or more of Si, Ge, Sn, Ti, Zr or Hf, (2) adding dissolved $A_2MnF_6$ to the $MO_2$+HF solution to provide a $A_2MnF_6$+$MO_2$+HF solution, where A is an Alkali metal, (3) dissolving $AHF_2$ in a second hydrofluoric acid solution to provide an $AHF_2$+HF solution, (4) adding the $AHF_2$+HF solution to the $A_2MnF_6$+$MO_2$+HF solution, and (5) extracting solid precipitates of $A_2MF_6:Mn^{4+}$ from the combination of the $AHF_2$+HF and the $A_2MnF_6$+$MO_2$+HF solutions. A semiconductor light emitting device is provided that includes an LED and a recipient luminophoric medium that is configured to down-convert at least some of the light emitted by the LED. The recipient luminophoric medium includes (1) a first luminescent material that down-converts a first portion of the radiation emitted by the LED to radiation having a first peak wavelength in the green color range, (2) a second luminescent material that down-converts a second portion of the radiation emitted by the LED to radiation having a second peak wavelength in the red color range, the second luminescent material having a full-width half maximum bandwidth of at least 70 nanometers, (3) a third luminescent material that down-converts a third portion of the radiation emitted by the LED to radiation having a third peak wavelength in the red color range, and (4) a fourth luminescent material that includes the $A_2MF_6:Mn^{4+}$ precipitates, the fourth luminescent material configured to down-convert a fourth portion of the radiation emitted by the LED to radiation having a fourth peak wavelength in the red color range.

Pursuant to still further embodiments of the present invention, semiconductor light emitting devices are provided that include an LED and a recipient luminophoric medium that is configured to down-convert at least some of the light emitted by the LED. The recipient luminophoric medium includes at least a first luminescent material that down-converts a first portion of the radiation emitted by the LED to radiation having a first peak wavelength that is in the green or yellow color ranges, a second luminescent material that down-converts a second portion of the radiation emitted by the LED to radiation having a second peak wavelength that is in the red color range, the second luminescent material having a full-width half maximum bandwidth of at least 70 nanometers, and a third luminescent material that down-converts a third portion of the radiation emitted by the LED to radiation having a third peak wavelength that is in the red color range and that is higher than the second peak wavelength, the third luminescent material having an emission peak that has a full-width half maximum bandwidth of less than 25 nanometers. In these light emitting devices, the second peak wavelength is within twenty (20) nanometers of the third peak wavelength.

In some embodiments, the third luminescent material may be a $K_2SiF_6:Mn^{4+}$ phosphor having a peak wavelength between 630 and 640 nm, and the second luminescent material may be a $(Ca_{1-x}Sr_x)SiAlN_3:Eu^{2+}$ phosphor having a peak wavelength between 610 and 630 nm. An emission spectrum of the semiconductor light emitting device may include a first peak that is attributable to the third luminescent material that is at least 50% greater than any point in the emission spectrum in the yellow or green color ranges. The third luminescent material may emit light having multiple distinct peaks in the red color range, where a first of the multiple distinct peaks may be at a wavelength that is less than a second peak wavelength and a second of the multiple distinct peaks may be at a wavelength that is greater than the second peak wavelength. In some embodiments, the first and second of the multiple of the distinct peaks may be the highest two of the multiple of the distinct peaks.

In some embodiments, the first luminescent material may be a YAG:Ce phosphor, the second luminescent material may be a $(Ca_{1-x}Sr_x)SiAlN_3:Eu^{2+}$ phosphor, and the third luminescent material may be an $A_2MF_6:Mn^{4+}$ phosphor where A is an Alkali metal and M is an element with a 4+ valence. A ratio of the third luminescent material to the combination of the first and second luminescent materials by weight may be at least 2:3. The light output by the semiconductor light emitting device may have a correlated color temperature of between 2700 K and 2850 K, a CRI value of between 80 and 92, a CRI R9 value of between 30 and 70, and a Qg value of between 90 and 110. The semiconductor device may be part of a bulb or fixture that does not include any red light emitting semiconductor light emitting devices. The third luminescent material may emit light having multiple distinct peaks in the red color range, and a peak wavelength of a spectral output of the second luminescent material in response to the second portion of the radiation emitted by the LED may be at a wavelength that is within the highest or second highest of the multiple distinct peaks.

Pursuant to yet additional embodiments, semiconductor light emitting devices are provided that include an LED that emits light having a peak wavelength in a blue color range and an associated recipient luminophoric medium that is configured to down-convert at least some of the light emitted by the LED. The recipient luminophoric medium may include at least a YAG:Ce phosphor, a $(Ca_{1-x}Sr_x)SiAlN_3:Eu^{2+}$ phosphor that down-converts a second portion of the radiation emitted by the LED to radiation having a second peak wavelength that is between 610 and 635 nm and an $A_2MF_6:Mn^{4+}$ phosphor where A is an Alkali metal and M is an element with a 4+ valence that down-converts a third portion of the radiation emitted by the LED to radiation having a third peak wavelength that is between 625 and 640 nm, the third luminescent material having a full-width half maximum bandwidth of between 25 and 55 nm. The second peak wavelength is within twenty (20) nanometers of the third peak wavelength and the semiconductor light emitting device emits light having a CRI value of between 80 and 92, a CRI R9 value of between 30 and 70, a correlated color temperature of between 2700 K and 2850 K, and a Qg value of between 90 and 110.

In some embodiments an emission spectrum of the semiconductor light emitting device may include a first peak that is attributable to the $A_2MF_6:Mn^{4+}$ phosphor that has a magnitude that is at least twice the magnitude of any point in emission spectrum in the yellow or green color ranges. The $A_2MF_6:Mn^{4+}$ phosphor may be at least 70% of the total weight of the combination of the YAG:Ce, $A_2MF_6:Mn^{4+}$ and $(Ca_{1-x}Sr_x)SiAlN_3:Eu^{2+}$ phosphors. The $A_2MF_6:Mn^{4+}$ phosphor may emit light having multiple distinct peaks in the red color range, and a highest of the multiple distinct peaks may be at a wavelength that is greater than a peak wavelength of a spectral output of the and $(Ca_{1-x}Sr_x)SiAlN_3:Eu^{2+}$ phosphor, and a second highest of the multiple distinct peaks may be at a wavelength that is less than the peak wavelength of the spectral output of the $(Ca_{1-x}Sr_x)SiAlN_3:Eu^{2+}$ phosphor. The $A_2MF_6:Mn^{4+}$ phosphor may emit light having multiple distinct peaks in the red color range, and a peak wavelength of a spectral output of the $(Ca_{1-x}Sr_x)SiAlN_3:Eu^{2+}$ phosphor in response to the second portion of the radiation emitted by the LED may be at a wavelength that is within the highest or second highest of the multiple distinct peaks.

DETAILED DESCRIPTION

The present invention is directed to semiconductor light emitting devices having recipient luminophoric mediums that include multiple red light emitting luminescent materials including at least one narrow-spectrum red light emitting luminescent material, and to related luminescent materials and methods of manufacturing such luminescent materials. The semiconductor light emitting devices according to embodiments of the present invention may emit white light and may exhibit very high luminous flux levels while providing excellent color rendering performance.

As used herein, the term "semiconductor light emitting device" refers to a light emitting device that includes at least one LED. The semiconductor light emitting devices according to embodiments of the present invention may be provided, for example, as packaged lamps or as bulbs or light fixtures.

Semiconductor light emitting devices according to embodiments of the invention may include III-V nitride (e.g., gallium nitride) based LEDs fabricated on a silicon carbide, sapphire or gallium nitride substrates such as various devices manufactured and/or sold by Cree, Inc. of Durham, N.C. Such LEDs may (or may not) be configured to operate such that light emission occurs through the growth substrate (or a semiconductor layer that was near the growth substrate if the growth substrate is removed) in a so-called "flip chip" orientation. Semiconductor light emitting devices according to embodiments of the present invention include both vertical devices with a cathode contact on one side of the LED, and an anode contact on an opposite side of the LED and devices in which both contacts are on the same side of the device. The design and fabrication of semiconductor light emitting devices are well known to those skilled in the art, and hence further description thereof will be omitted.

Visible light may include light having many different wavelengths. The apparent color of visible light can be illustrated with reference to a two-dimensional chromaticity diagram, such as the 1931 CIE Chromaticity Diagram illustrated in FIG. 1. Chromaticity diagrams provide a useful reference for defining colors as weighted sums of colors.

Figure 1:
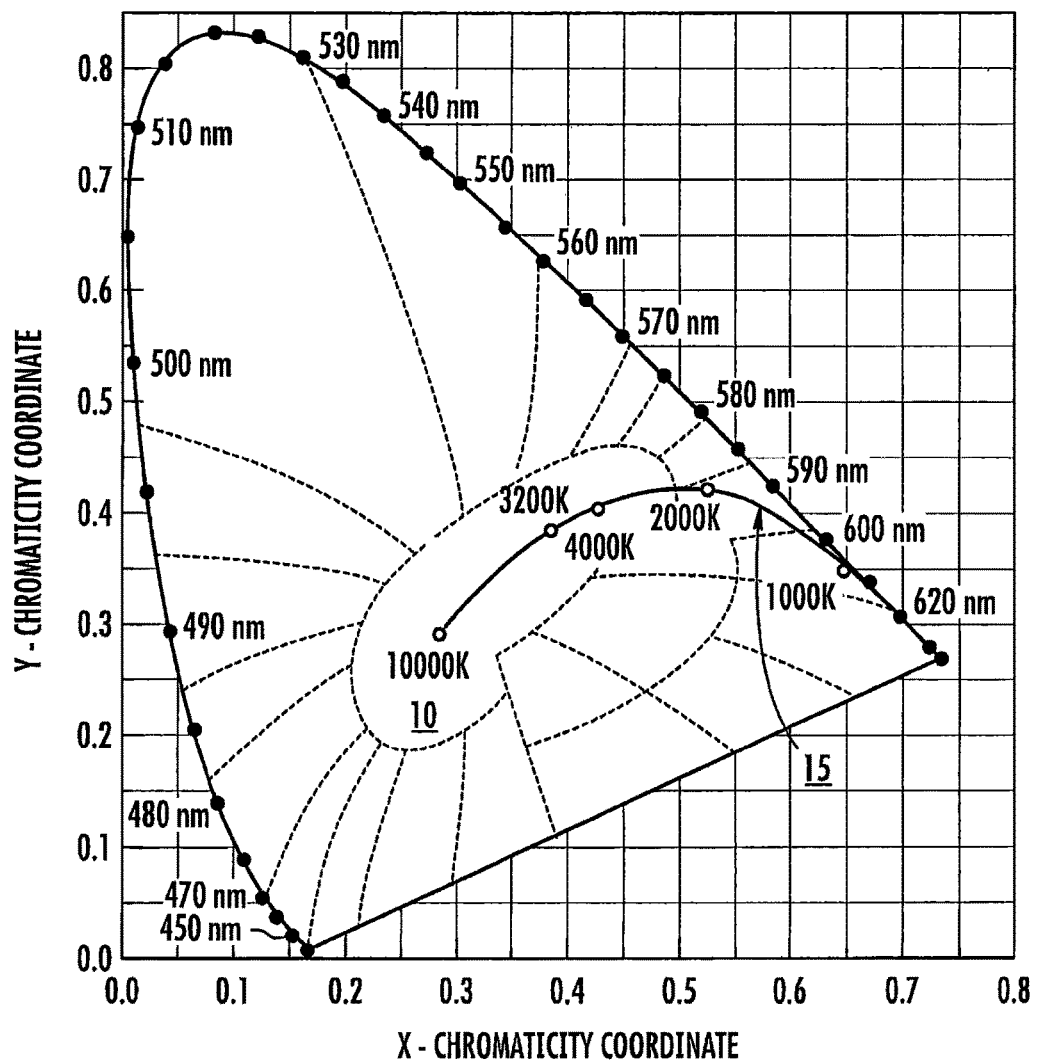
FIG. 1 is a graph of a 1931 CIE Chromaticity Diagram illustrating the location of the planckian locus.

As shown in FIG. 1, colors on a 1931 CIE Chromaticity Diagram are defined by x and y chromaticity coordinates that fall within a generally U-shaped area. Colors on or near the outside of the area are saturated colors composed of light having a single wavelength, or a very small wavelength distribution. Colors on the interior of the area are unsaturated colors that are composed of a mixture of different wavelengths. White light, which can be a mixture of many different wavelengths, is generally found near the middle of the diagram, in the region labeled 10 in FIG. 1. There are many different hues of light that may be considered "white," as evidenced by the size of the region 10. For example, some "white" light, such as light generated by sodium vapor lighting devices, may appear yellowish in color, while other "white" light, such as light generated by some fluorescent lighting devices, may appear more bluish in color.

A binary combination of light from light sources emitting light of first and second colors may appear to have a different color than either of the two constituent colors. The color of the combined light may depend on the wavelengths and relative intensities of the two light sources. For example, light emitted by a combination of a blue source and a red source may appear purple or magenta to an observer. Similarly, light emitted by a combination of a blue source and a yellow source may appear white to an observer.

Each point in the graph of FIG. 1 is referred to as the "color point" of a light source that emits a light having that color. As shown in FIG. 1 a locus of color points that is referred to as the "black-body" locus 15 exists which corresponds to the location of color points of light emitted by a black-body radiator that is heated to various temperatures. The black-body locus 15 is also referred to as the "planckian" locus because the chromaticity coordinates (i.e., color points) that lie along the black-body locus obey Planck's equation: $E(\lambda)=A\ \lambda^{-5}/(e^{B/T}-1)$, where E is the emission intensity, $\lambda$ is the emission wavelength, T is the color temperature of the black-body and A and B are constants. Color coordinates that lie on or near the black-body locus 15 yield pleasing white light to a human observer.

As a heated object becomes incandescent, it first glows reddish, then yellowish, and finally bluish with increasing temperature. This occurs because the wavelength associated with the peak radiation of the black-body radiator becomes progressively shorter with increased temperature, consistent with the Wien Displacement Law. Illuminants that produce light which is on or near the black-body locus 15 can thus be described in terms of their correlated color temperature ("CCT"). As used herein, the term "white light" refers to light that is perceived as white, is within 7 MacAdam ellipses of the black-body locus on a 1931 CIE chromaticity diagram, and has a CCT ranging from 2000K to 10,000K. White light with a CCT of 4000K may appear yellowish in color, while white light with a CCT of 8000K or more may appear more bluish in color, and may be referred to as "cool" white light. "Warm" white light may be used to describe white light with a CCT of between about 2500K and 4500K, which is more reddish or yellowish in color. Warm white light is generally a pleasing color to a human observer. Warm white light with a CCT of 2500K to 3300K may be preferred for certain applications.

The ability of a light source to accurately reproduce color in illuminated objects is typically characterized using the color rendering index ("CRI"). The CRI of a light source is a modified average of the relative measurements of how the color rendition of an illumination system compares to that of a reference black-body radiator when illuminating eight reference colors. Thus, the CRI is a relative measure of the shift in surface color of an object when lit by a particular lamp. The CRI equals 100 if the color coordinates of a set of test colors being illuminated by the illumination system are the same as the coordinates of the same test colors being irradiated by the black-body radiator. Daylight generally has a CRI of nearly 100, incandescent bulbs have a CRI of about 95, fluorescent lighting typically has a CRI of about 70 to 85, while monochromatic light sources have a CRI of essentially zero. Light sources for general illumination applications with a CRI of less than 50 are generally considered very poor and are typically only used in applications where economic issues preclude other alternatives. Light sources with a CRI value between 70 and 80 have application for general illumination where the colors of objects are not important. For some general interior illumination, a CRI value of greater than 80 is acceptable. A light source with color coordinates within 4 MacAdam step ellipses of the planckian locus 15 and a CRI value that exceeds 85 is more suitable for general illumination purposes. Light sources with CRI values of more than 90 provide greater color quality.

For backlight, general illumination and various other applications, it is often desirable to provide a lighting source that generates white light having a relatively high CRI, so that objects illuminated by the lighting source may appear to have more natural coloring to the human eye. Accordingly, such lighting sources may typically include an array of semiconductor lighting devices including red, green and blue light emitting devices. When red, green and blue light emitting devices are energized simultaneously, the resulting combined light may appear white, or nearly white, depending on the relative intensities of the red, green and blue sources. However, even light that is a combination of red, green and blue emitters may have a low CRI, particularly if the emitters generate saturated light, because such light may lack contributions from many visible wavelengths.

CRI is an average color rendering value for eight specific sample colors that are generally referred to as R1-R8. Additional sample colors R9-R15 are also often used in evaluating the color rendering properties of a light source. The sample color R9 is the saturated red color, and it is generally known that the ability to reproduce red colors well is important for accurately rendering colors, as the color red is often found mixed into processed colors. Accordingly, all else being equal, lamps with high R9 values tend to produce the most vivid colors. Thus, the CRI R9 value of light emitted by a light source is also often considered to be an important performance parameter for a light source.

Another important performance parameter for an LED lighting source is the intensity of the light emitted, which is referred to as the "radiant flux" of the device. However, as the human eye has varying sensitivity to different wavelengths of light, the intensity of the light emitted by a lighting source is most typically measured in terms of the lighting source's "luminous flux," which is a measure of the power of the light emitted by a light source as perceived by a human observer. The luminous flux of a light source is typically measured in lumens (lm). The luminous flux of a light source differs from the radiant flux of the light source in that the radiant flux measures the total power emitted, while the luminous flux weights the power of the light emitted at each wavelength based on a luminosity function which represents the response of the human eye for each different wavelength.

Figure 2:
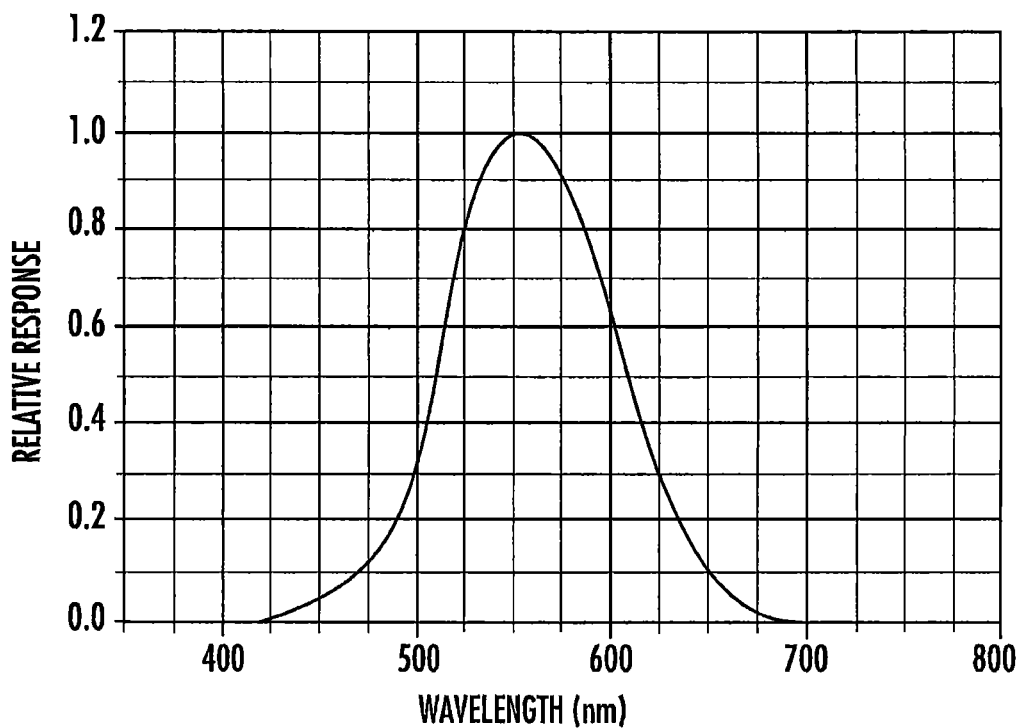
FIG. 2 is a graph illustrating the response of the human eye to light in the visible light spectrum.

FIG. 2 is a graph of the above-referenced luminosity function that corresponds to the response of the human eye to light in the visible light spectrum. As shown in FIG. 2, the human eye cannot perceive light at wavelengths below about 400 nanometers and above about 700 nanometers. The maximum response of the human eye to light occurs at about 555 nanometers. In calculating luminous flux, the radiant flux of a light source is weighted based on the eye sensitivity curve of FIG. 2. As the amount of light emitted by an LED is generally a function of the power input to the LED, the luminous flux performance of semiconductor light emitting devices are typically compared with each device being driven at the same input power level or, alternatively, the devices may be compared in terms of the luminous flux per unit of input power (e.g., lumens per Watt) that each device emits at the input power level for which each device is designed to operate.

Because of the varying sensitivity of the human eye to light of different wavelengths, there tends to be a tradeoff between the luminous flux of the light emitted by an LED lighting source and the CRI of the light emitted. For example, since the human eye is most sensitive to light at a wavelength of about 555 nm, a monochromatic light source at 555 nm would exhibit a high luminous flux value. However, in order to obtain high CRI values, it is generally necessary to have light contribution across a wide range of wavelengths, including wavelengths that are relatively far away from 555 nm where the peak sensitivity of light to the human eye occurs. This is particularly true with respect to CRI R9 performance which is a measure of color rendering in the red color range. Because the human eye has reduced sensitivity to the wavelengths on either end of the visible light spectrum, the light contributions that are often added to improve the CRI of a device may result in a decrease in the luminous flux of the device.

Embodiments of the present invention include semiconductor light emitting devices that have recipient luminophoric mediums that include luminescent materials that have peak emission wavelengths in various color ranges. For purposes of this disclosure, the various color ranges of visible light are defined as shown in Table 1 below. It will be appreciated, however, that there are not sharp boundaries between different colors of the spectrum. For example, light having wavelengths from 430-450 nm may appear blue-violet, while light having wavelengths from 540-560 nm may appear yellow-green, etc.

TABLE 1

| Color | Wavelength Range (nm) |
| --- | --- |
| Blue | 440-479 |
| Cyan | 480-510 |
| Green | 511-549 |
| Yellow | 550-580 |
| Orange | 581-604 |
| Red | 605-700 |

An LED or a luminescent material that emits light having a peak wavelength in one of the above color ranges may be referred to with reference to the color range. By way of example, a phosphor that emits light having a peak wavelength of 630 nanometers may be referred to herein as a "red phosphor," while a phosphor that emits light having a peak wavelength of 535 nanometers may be referred to as a "green phosphor."

Phosphors and other luminescent materials may, when excited, emit light over a broad range of wavelengths or over a narrower range of wavelengths. Herein, phosphors having emission spectrums that have FWHM widths of 70 nanometers or more are referred to as "broad-spectrum" or "broadband" phosphors or luminescent materials. In contrast, luminescent materials that, when excited, emit light having FWHM widths of 60 nanometers or less are referred to "narrow-spectrum" or "narrowband" luminescent materials.

Figure 3:
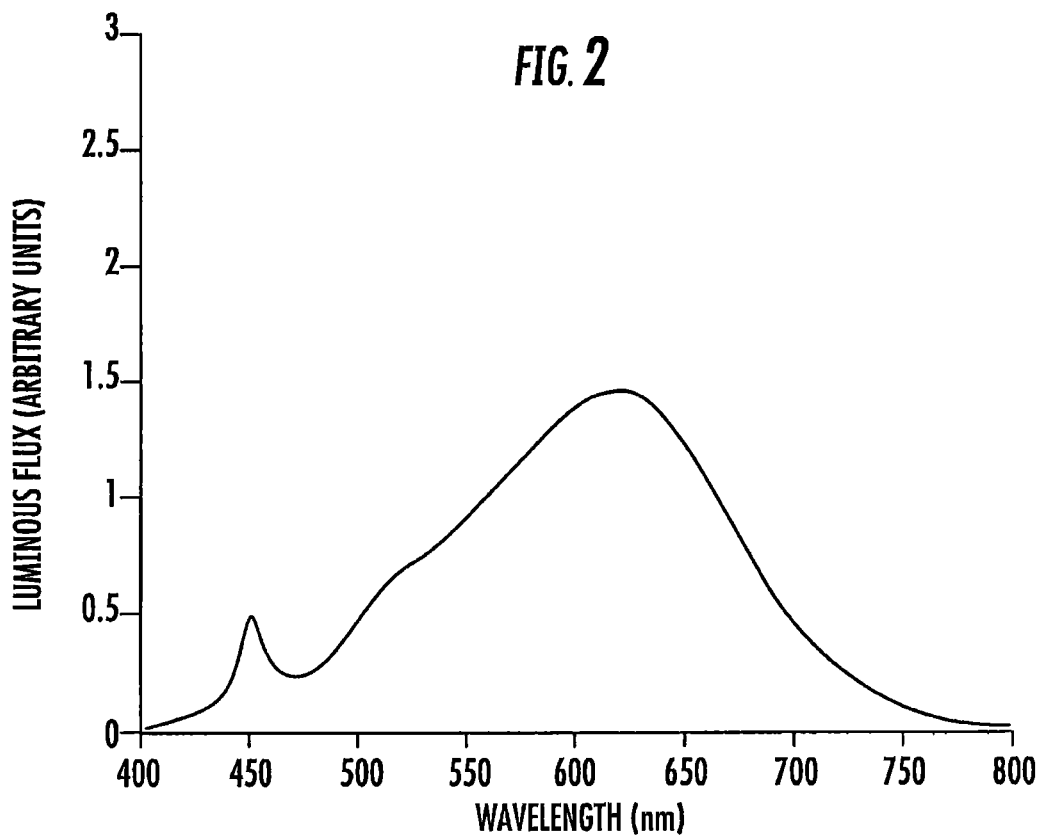
FIG. 3 is a graph illustrating the intensity of the radiation emitted as a function of wavelength for a conventional state-of-the-art semiconductor light emitting device that emits warm white light.

FIG. 3 is a graph illustrating the intensity of the radiation emitted as a function of wavelength (i.e., the emission spectrum) for a conventional state-of-the-art warm white semiconductor light emitting device that includes a first broad-spectrum green $Lu_3Al_5O_{12}$:Ce phosphor (herein referred to as a "LuAG:Ce phosphor") having a peak wavelength between 530-540 nanometers, a second broad-spectrum red $(Ca_{1-x}Sr_x)SiAlN_3$:$Eu^{2+}$ phosphor having a peak wavelength between 620 and 640 nanometers, and a third broad-spectrum red $(Ca_{1-x}Sr_x)SiAlN_3$:$Eu^{2+}$ phosphor having a peak wavelength between 640 and 660 nanometers.

As shown in FIG. 3, the emission spectrum for the above-described conventional state-of-the-art warm white semiconductor light emitting device has a small peak around 450 nanometers that corresponds to the light emitted by the blue LED that passes through the recipient luminophoric medium without being absorbed by the phosphors. The emission spectrum further includes a broad peak at around 635 nanometers having a higher radiant flux than the small peak in the blue color range.

U.S. Pat. No. 8,921,875 ("the '875 patent") proposes other white light emitting semiconductor light emitting devices which each may include a green and/or yellow phosphor, a broad-spectrum red phosphor and a narrow-spectrum red phosphor. The '875 patent explains that red phosphors generally can be classified into two categories, namely stable and unstable phosphors. The more unstable red phosphors are BOSE, sulfides and other non-nitride phosphors, while the more stable red phosphors are nitride-based phosphors such as the above-referenced $(Ca_{1-x}Sr_x)SiAlN_3$:$Eu^{2+}$ phosphor. The nitride-based red phosphors are typically characterized by broad emission spectrums (e.g., FWHM widths of greater than 80 nm) and relatively high peak wavelengths (e.g., between about 630 nm and about 660 nm)

The '875 patent teaches that nitride-based red phosphors that have lower peak wavelengths (e.g., between about 610 nm and about 629 nm) and generally narrower emission spectrum (e.g., FWHM widths of between 60 nm and 80 nm) may be used in place of the above-described higher peak wavelength nitride-based red phosphors to provide improved performance. In particular, the '875 patent teaches that the use of lower peak wavelength red phosphors reduce the Stoke's shift (i.e., the difference between the peak wavelength of the light absorbed by the phosphor and the peak wavelength of the light emitted by the phosphor), which is beneficial as large Stoke's shift values can limit the conversion efficiency of a phosphor (i.e., the percentage of incident light that is absorbed by the phosphor that is actually converted to light that is output by the phosphor). The '875 patent further explains that narrow-spectrum luminescent materials may be used as a means of filling in gaps in the emission spectrum such as, for example, a gap that may appear between the peak emission wavelength of a yellow phosphor and the peak emission wavelength of a broad-spectrum red phosphor.

Pursuant to embodiments of the present invention, semiconductor light emitting devices are provided that emit white light at significantly higher luminous flux levels (for a fixed amount of input power) without sacrificing performance in terms of color rendering or the color point of the device. In some embodiments, the semiconductor light emitting devices according to embodiments of the present invention may provide an increase in luminous flux of 10% or more as compared to conventional state-of-the-art semiconductor light emitting devices.

In some embodiments, the semiconductor light emitting devices may include one or more LEDs and a recipient luminophoric medium that includes a first luminescent material that emits light having a peak wavelength in the green or yellow color ranges, and second, third and fourth luminescent materials that each emit light having peak wavelengths in the red color range. In some embodiments, the second and third luminescent materials may be broadspectrum luminescent materials that have FWHM bandwidths of at least 70 nanometers, while the fourth luminescent material may be a narrow-spectrum luminescent material that has a FWHM bandwidth of less than 60 nanometers. The peak wavelength of the fourth narrow-spectrum luminescent material may be between the peak wavelengths of the second and third broad-spectrum luminescent materials.

In some embodiments, the peak wavelengths of the light emitted by the second and third luminescent materials may be within 40 nanometers of each other or less (e.g., 35, 30, 25 or 20 nanometers in various embodiments), and hence the peak wavelengths of all three red light emitting luminescent materials may be tightly clustered within a narrow wavelength range. The amounts of the three red luminescent materials included in the recipient luminophoric medium may be selected so that the emission of the semiconductor light emitting device in the 650-700 nanometer range is reduced as compared to many conventional state-of-the-art semiconductor light emitting devices in order to increase the luminous flux of the device.

In some embodiments, the second and third luminescent materials may be broad-spectrum luminescent materials and may have a combined spectral output (in response to light emitted by the blue LED) that has a peak wavelength that is in the red color range. In some such embodiments, the fourth narrow-spectrum red luminescent material may have a peak wavelength that is within 5 to 20 nanometers of the peak wavelength of the combined spectral output of the second and third broad-spectrum red luminescent materials. This approach non-intuitively concentrates the light emitted by the three red luminescent materials in a relatively narrow range, yet still provides a combined light output that has extremely high luminous flux while maintaining excellent color rendering properties.

In other embodiments, semiconductor light emitting devices are provided that includes one or more blue LEDs and an associated recipient luminophoric medium that has the above-described first through fourth luminescent materials and that have an emission spectrum that includes a first peak at the peak wavelength of the fourth narrow-spectrum red luminescent material that is at least 50% greater than any point in the emission spectrum within the green or yellow color ranges. In other words, in these embodiments, the spectral output power of the semiconductor light emitting device at the peak wavelength of the fourth narrow-spectrum red luminescent material is significantly greater than the spectral output power within the green and yellow color ranges, which are the color ranges that are best perceived by the human eye.

In still other embodiments, semiconductor light emitting devices are provided that includes one or more blue LEDs and an associated recipient luminophoric medium that has the above-described first through fourth luminescent material, where the fourth luminescent material emits light that has multiple distinct peaks in the red color range. In these embodiments, a first of the multiple distinct peaks may be at a wavelength that is less than a peak wavelength of a combined spectral output of the second and third luminescent materials in response to the respective second and third portions of the radiation emitted by the LED, and a second of the multiple distinct peaks is at a wavelength that is greater than a peak wavelength of the combined spectral output of the second and third luminescent materials in response to the respective second and third portions of the radiation emitted by the LED. The first and second of the multiple distinct peaks may be the peaks in the emission spectrum of the fourth luminescent material that have the highest spectral output power.

In yet additional embodiments, semiconductor light emitting devices are provided that includes one or more blue LEDs and an associated recipient luminophoric medium that has a first luminescent material that emits light having a first peak wavelength in the green or yellow color ranges, a second broad-spectrum luminescent material that emits light having a second peak wavelengths in the red color range, and a third $A_2MF_6$:$Mn^{4+}$ phosphor, where A is an Alkali metal and M is an element with a 4+ valence (e.g., a $K_2SiF_6$:$Mn^{4+}$ phosphor) that emits light having a third peak wavelengths in the red color range. The second and third peak wavelengths may be within twenty (20) nanometers of each other.

In still further embodiments, semiconductor light emitting devices are provided that include one or more blue LEDs and an associated recipient luminophoric medium that includes a first luminescent material that down-converts a first portion of the radiation emitted by the LED to radiation having a first peak wavelength that is in the green or yellow color ranges; a second luminescent material that down-converts a second portion of the radiation emitted by the LED to radiation having a second peak wavelength that is in the red color range, the second luminescent material having a full-width half maximum bandwidth of at least 70 nanometers; and a third luminescent material that down-converts a third portion of the radiation emitted by the LED to radiation having a third peak wavelength that is in the red color range and that is higher than the second peak wavelength, the third luminescent material having a full-width half maximum bandwidth of less than 60 nanometers. In these devices, the second peak wavelength is within twenty (20) nanometers of the third peak wavelength. In some embodiments, the third luminescent material may be a $K_2SiF_6$:$Mn^{4+}$ phosphor having a peak wavelength between 630 and 640 nm, and the second luminescent material may be a $(Ca_{1-x}Sr_x)SiAlN_3$:$Eu^{2+}$ phosphor having a peak wavelength between 610 and 630 nm.

In yet other embodiments, semiconductor light emitting devices are provided that include one or more blue LEDs and a recipient luminophoric medium that includes at least a YAG:Ce phosphor; a $(Ca_{1-x}Sr_x)SiAlN_3$:$Eu^{2+}$ phosphor that emits light having a peak wavelength that is between 610 and 635 nm; and an $A_2MF_6$:$Mn^{4+}$ phosphor where A is an Alkali metal and M is an element with a 4+ valence that emits light having a peak wavelength that is between 625 and 640 nm, the $A_2MF_6$:$Mn^{4+}$ phosphor having an emission peak that has a full-width half maximum bandwidth of less than 25 nm. The emission peak of the $A_2MF_6$:$Mn^{4+}$ phosphor is between 625 and 640 nm and that has a full-width half maximum bandwidth of less than 25 nm may be one of multiple emission peaks. In cases where the $A_2MF_6:Mn^{4+}$ phosphor has multiple emission peaks, the peak that is between 625 and 640 nm and that has a full-width half maximum bandwidth of less than 25 nm may be the highest peak in some embodiments. In these devices, the peak wavelength of the $(Ca_{1-x}Sr_x)SiAlN_3:Eu^{2+}$ phosphor is within twenty (20) nanometers of the peak wavelength, of the $A_2MF_6:Mn^{4+}$ phosphor, and the device may emit light having a CRI value of between 80 and 92, a CRI R9 value of between 30 and 70, a correlated color temperature of between 2700 K and 2850 K, and a Qg value (which is defined below) of between 90 and 110.

Additionally, pursuant to further embodiments of the present invention, methods of manufacturing the above described semiconductor light emitting devices are provided, as well as methods for synthesizing the narrow-spectrum red luminescent materials that may be used in some embodiments of the semiconductor light emitting devices according to embodiments of the present invention.

Example embodiments of the present invention will now be discussed with reference to FIGS. 4-12.

Figure 4:
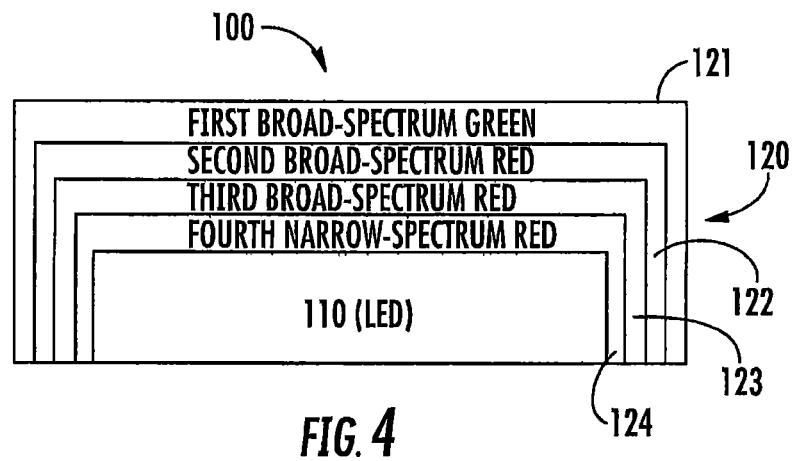
FIG. 4 is a schematic cross-sectional view of a semiconductor light emitting device according to certain embodiments of the present invention.

White light emitting semiconductor light emitting devices are provided pursuant to embodiments of the present invention that exhibit increased lumens/Watt output, high CRI values, good CRI R9 performance and good color quality: One such semiconductor light emitting device 100 is schematically depicted in FIG. 4. As shown in FIG. 4, the semiconductor light emitting device 100 includes an LED 110 and a recipient luminophoric medium 120. The LED may comprise, for example, a blue LED 110 that emits light having a peak wavelength between, for example, 440 nanometers and 475 nanometers. In some embodiments, the blue LED 110 may emit light having a peak wavelength between 445 and 460 nanometers.

The recipient luminophoric medium 120 may include a plurality of luminescent materials that are suspended, for example, in one or more binder layers. In the depicted embodiment, the recipient luminophoric medium 120 includes four phosphors, namely a first broad-spectrum green LuAG:Ce phosphor having a peak wavelength between 530-540 nanometers, a second broad-spectrum red $(Ca_{1-x}Sr_x)SiAlN_3:Eu^{2+}$ phosphor having a peak wavelength between 620 and 640 nanometers, a third broad-spectrum red $(Ca_{1-x}Sr_x)SiAlN_3:Eu^{2+}$ phosphor having a peak wavelength between 640 and 660 nanometers, and a fourth narrow-spectrum red phosphor having a peak wavelength between 630 and 640 nanometers. In some embodiments, the second and third broad-spectrum red phosphors may each have a FWHM width of about 70-100 nanometers, and may have different calcium-to-strontium ratios to achieve the different peak wavelengths. In some embodiments, the first broad-spectrum green phosphor and the second and third broad-spectrum red phosphors may be the same phosphors included in the conventional state-of-the-art white semiconductor light emitting device that is discussed above with reference to FIG. 3, although the relative amounts of the second and third broad-spectrum red phosphors may be varied based on the addition of the fourth narrow-spectrum red phosphor in the semiconductor light emitting device 100 according to embodiments of the present invention.

In some embodiments, the second broad-spectrum red $(Ca_{1-x}Sr_x)SiAlN_3:Eu^{2+}$ phosphor may have a material composition that is configured to have an emission spectrum with a peak wavelength of about 620-640 nanometers when excited by light having a wavelength between 440 and 475 nanometers. For example, the second broad-spectrum red $(Ca_{1-x}Sr_x)SiAlN_3:Eu^{2+}$ phosphor may have a europium content of about 0.02 to 0.03, and may have a strontium content of about 0.80 to about 0.92. In one particular embodiment, the second broad-spectrum red phosphor may have a strontium concentration of about 0.87, a europium concentration of about 0.025, a calcium concentration of 0.105 and a peak wavelength of about 630 nanometers.

In some embodiments, the third broad-spectrum red $(Ca_{1-x}Sr_x)SiAlN_3:Eu^{2+}$ phosphor may have a material composition that is configured to have an emission spectrum with a peak wavelength of about 640-660 nanometers when excited by light having a wavelength between 440 and 475 nanometers. In particular, the third broad-spectrum red nitride phosphor may have a europium content of about 0.003 to 0.015, and may have a strontium content of about 0.15 to about 0.3. In one particular embodiment, the third broad-spectrum red phosphor may have a strontium concentration of about 0.20, a europium concentration of about 0.006, a calcium concentration of 0.794 and a peak wavelength of about 650 nanometers.

In some embodiments, the fourth narrow-spectrum red phosphor may comprise an $A_2MF_6:Mn^{4+}$ phosphor where A is an Alkali metal and M is an element with a 4+ valence. For example, in one particular embodiment, the fourth narrow-spectrum phosphor may comprise a $K_2SiF_6:Mn^{4+}$ phosphor.

In the depicted embodiment, the first through fourth phosphors are included in separate layers 121-124. The first layer 121 that is farthest from the LED 110 includes the first broad-spectrum green phosphor, the second layer 122 that is second-farthest from the LED 110 includes the second broad-spectrum red phosphor, the third layer 123 that is the second closest to the LED 110 includes the third broad-spectrum red phosphor, and the fourth layer 124 that is closest to the LED 110 includes the fourth narrow-spectrum red phosphor. It will be appreciated that in other embodiments the luminescent materials may all be mixed together in a single layer (or in two or three layers), or that more than four layers may be used. It will also be appreciated that the order of the layers may be changed.

In some embodiments, the ratio, by weight, of the first green phosphor to the second, third and fourth red phosphors may be between 2:1 and 3:1. The ratio, by weight, of the second and third red phosphors to the fourth red phosphor may be between 1:3 and 1:6. The ratio, by weight, of the second red phosphor to the third red phosphor may be between 3:1 and 1:1.

Figure 5:
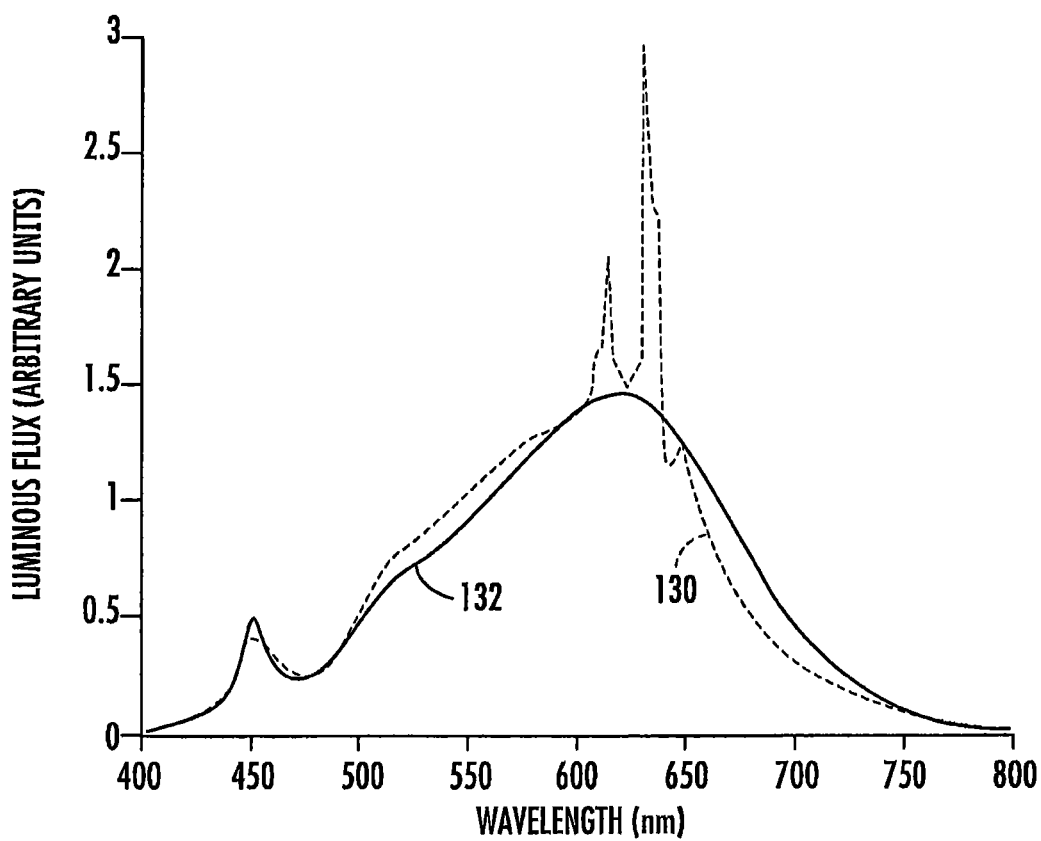
FIG. 5 is a graph illustrating the intensity of the radiation emitted as a function of wavelength for a semiconductor light emitting device according to certain embodiments of the present invention, and also includes the emission spectra for the conventional semiconductor light emitting device of FIG. 3 for comparison purposes.

FIG. 5 is a graph of the emission spectrum 130 for the warm white semiconductor light emitting device 100 according to embodiments of the present invention. For comparative purposes, the emission spectrum 132 of the conventional warm white semiconductor lighting device of FIG. 3 is also included in the graph of FIG. 5.

As shown in FIG. 5, the emission spectra 130, 132 for the two semiconductor light emitting devices differ in several significant ways. First, the emission spectrum 130 for the semiconductor light emitting device 100 includes increased spectral output in wavelength ranges from about 500 nanometers to about 600 nanometers. As this increased spectral output is in the wavelength range that is most readily perceived by the human eye, this increase in spectral output can result in a significant increase in the luminous flux for the device. Second, the emission spectrum 130 for the semiconductor light emitting device 100 according to embodiments of the present invention includes two significant peaks in the red color range, the first at about 620 nanometers and the second at about 635 nanometers. These spectral peaks may not contribute heavily to the luminous flux of the device because they are narrow and at high wavelengths, but may improve the CRI and CRI R9 performance of the device by increasing the amount of spectral output in the red color range. Third, the emission spectrum 130 for the semiconductor light emitting device 100 according to embodiments of the present invention has reduced spectral output for wavelengths from about 650 to 700 nanometers as compared to the emission spectrum 132 for the conventional semiconductor light emitting device. While this results in a very slight decrease in the luminous flux of the semiconductor light emitting device 100, the human eye is not very sensitive to light in this wavelength range and hence the reduction in luminous flux is small, and is more than offset by the increased spectral output in the 600-650 nanometer range. The decrease in spectral output in the 650-700 nanometer range also reduces the CRI performance of the device, but this decrease is generally offset by the increased spectral output in the 600-650 nanometer range. Thus, the semiconductor light emitting device 100 according to embodiments of the present invention may provide improved performance as compared to the conventional semiconductor light emitting device.

The emission spectrum in FIG. 5 for the semiconductor light emitting device 100 according to embodiments of the present invention also has several other interesting characteristics. For example, the power of the peak emission in the red color range is twice as high (or more) than the power of the peak emissions in the green and yellow color ranges. As another example, the peak wavelength of the fourth narrow-spectrum red phosphor (about 634 nanometers) is between the peak wavelengths of the second and third broad-spectrum red phosphors (which have peak wavelengths of 629 and 650 nanometers in the particular embodiment of FIGS. 4-5). In some embodiments, the peak wavelength of the fourth narrow-spectrum red phosphor is within 30 nanometers of both the peak wavelength of the second broad-spectrum red phosphor and the peak wavelength of the third broad-spectrum red phosphor, and hence the peak wavelengths of all three red phosphors may be tightly grouped. In other embodiments, the peak wavelength of the fourth narrow-spectrum red phosphor may be within 25 nanometers or even within 20 nanometers of both the peak wavelength of the second broad-spectrum red phosphor and the peak wavelength of the third broad-spectrum red phosphor. In fact, while not shown in FIG. 5, in one particular embodiment, the combined spectral output of the second and third luminescent materials in response to the blue LED has a peak wavelength in the red color range at 635 nanometers, which is within 1 nanometer of the peak wavelength (634 nanometers) of the fourth narrow-spectrum red phosphor in response to the blue LED. In different embodiments of the present invention, the peak wavelength of the combined emission of the second and third broad-spectrum red phosphors may be within 10, 20, 30 or 40 nanometers of the peak wavelength of the fourth narrow-spectrum red phosphor when the second and third broad-spectrum red phosphors are excited by emission from the blue LED.

In the emission spectrum of FIG. 5, the peak emission occurs at the peak wavelength of the fourth narrow-spectrum red luminescent material. As shown in FIG. 5, this peak emission has a magnitude that is about twice the magnitude of the emission at any wavelength in the blue, cyan, green or yellow color ranges. The relative amounts of the various phosphors/luminescent materials may be adjusted in other embodiments so that the peak emission that occurs at the peak wavelength of the fourth narrow-spectrum red luminescent material is at least 1.5 times as high, at least 1.75 times as high, at least 2.5 times as high, or even at least 3.0 times as high as the magnitude of the emission at any wavelength in the blue, cyan, green and/or yellow color ranges. It will also be appreciated that in these additional embodiments the first phosphor may be a green phosphor or a yellow phosphor, the second phosphor may be a broad-spectrum red phosphor, and the third phosphor may be a broad-spectrum red phosphor, a narrow-spectrum red phosphor, or omitted altogether. It will further be appreciated that in any of the above-described embodiments the green phosphor may be replaced with a yellow phosphor or both a green phosphor and a yellow phosphor may be included in the recipient luminophoric medium.

Figure 6A:
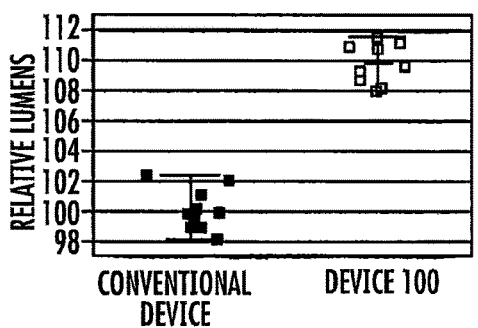
FIGS. 6A-6D are graphs that compare the performance of the semiconductor light emitting devices used to generate the graphs of FIGS. 3 and 5 in terms of luminous flux, color rendering index ("CRI") performance, CRI R9 performance and color point.
Figure 6B:
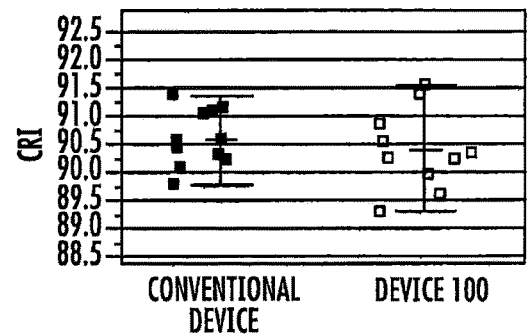
Figure 6C:
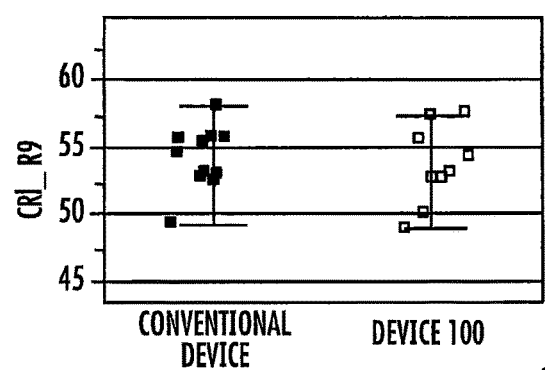

FIGS. 6A-6D are graphs that compare the performance of the conventional semiconductor light emitting device having the emission spectrum shown in FIG. 3 and the semiconductor light emitting device 100 according to embodiments of the present emission that is discussed above with reference to FIGS. 4-5. In particular, FIGS. 6A-6D compare the devices in terms of their luminous flux, color rendering index ("CRI") performance, CRI R9 performance and color point. In FIGS. 6A-6C, the data points are spread out slightly along the horizontal axis so that individual data points can be distinguished more clearly.

FIG. 6A is a graph that shows the measured luminous flux for ten semiconductor light emitting devices 100 according to embodiments of the present invention as compared to eleven of the above-described conventional semiconductor light emitting devices. All of the light emitting devices were powered at the same input power level in generating the graph of FIG. 6A. As shown in FIG. 6A, on average, the semiconductor light emitting devices 100 according to embodiments of the present invention exhibited luminous flux levels that were about ten percent higher than the conventional semiconductor light emitting devices. This represents a significant increase in luminous flux.

FIG. 6B shows the CRI performance for the twenty-one semiconductor light emitting devices used to generate FIG. 6A. As shown in FIG. 6B, the CRI performance is almost identical, with the conventional semiconductor light emitting devices exhibiting an average CRI of about 90.5 and the semiconductor light emitting devices 100 according to embodiments of the present invention exhibiting an average CRI value of about 90.4.

FIG. 6C shows the CRI R9 performance for the twenty-one semiconductor light emitting devices used to generate FIG. 6A. As shown in FIG. 6C, the CRI R9 performance of the two semiconductor light emitting device designs is also almost identical, with the conventional semiconductor light emitting devices exhibiting an average CRI R9 value of about 54, while the semiconductor light emitting devices 100 according to embodiments of the present invention exhibit an average CRI R9 value of about 53.

Figure 6D:
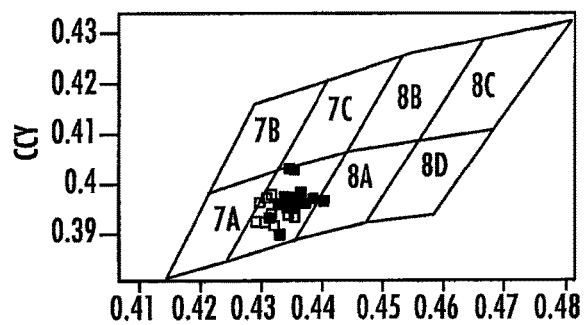

Finally, FIG. 6D shows the actual color point of each of the twenty-one semiconductor light emitting devices used to generate FIG. 6A. As shown in FIG. 6D, all of the semiconductor light emitting devices have color points falling in the same color bin and there is no discernible difference in the color points of the two different semiconductor light emitting device designs. The correlated color temperatures of the semiconductor light emitting devices used to generate FIG. 6D are between 2890K and 3070K, and hence all of the semiconductor light emitting devices emit warm white light. FIGS. 6A-6D show that the semiconductor light emitting devices 100 according to embodiments of the present invention may provide a significant (e.g., 10%) increase in luminous flux while maintaining the same color point and color rendering performance.

Figure 7:
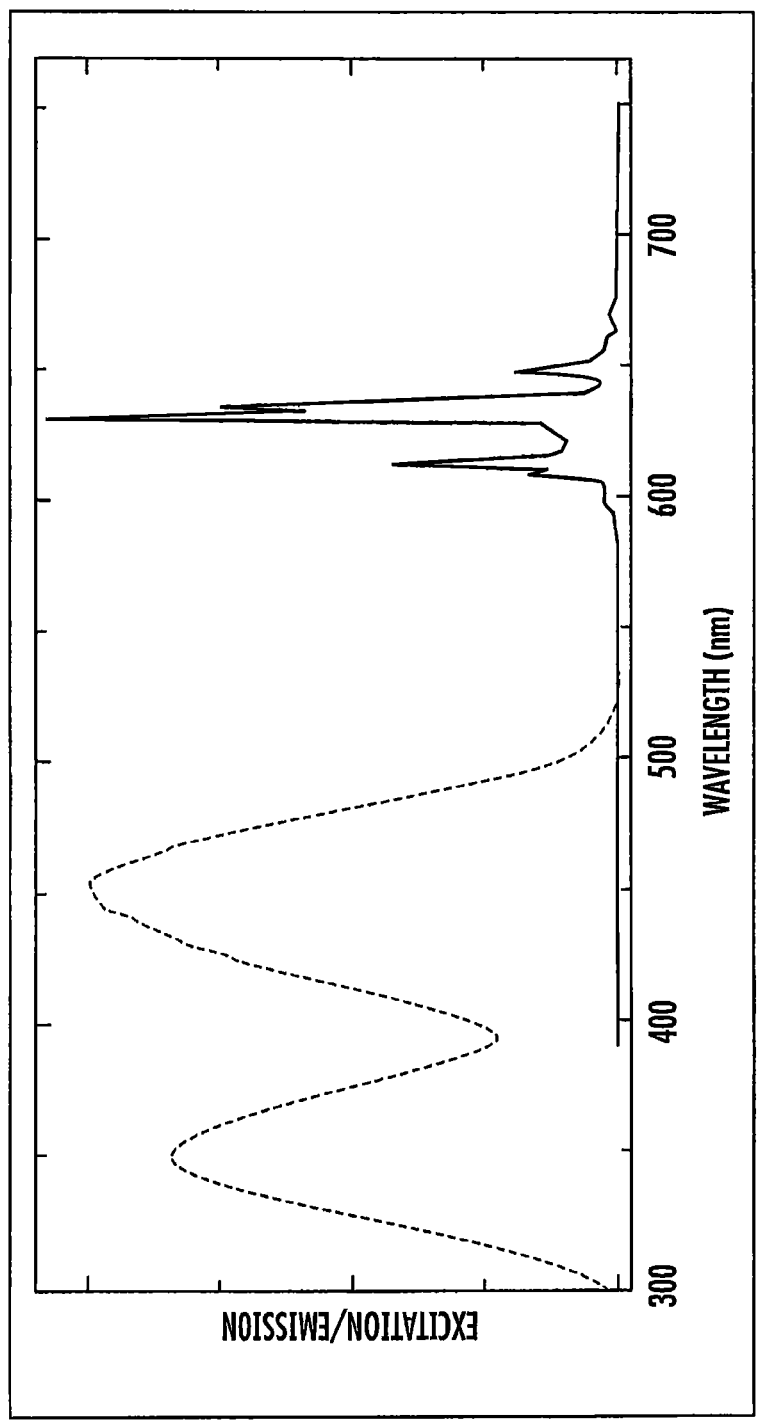
FIG. 7 is a graph illustrating the excitation and emission spectra of a narrow-spectrum red phosphor that may be included in semiconductor light emitting devices according to embodiments of the present invention.

As noted above, in some embodiments, the fourth narrow-spectrum red luminescent material may comprise an $A_2MF_6$:$Mn^{4+}$ phosphor, where A is an Alkali metal and M is an element with a 4+ valence (e.g., a $K_2SiF_6$:$Mn^{4+}$ phosphor). FIG. 7 is a graph illustrating the excitation and emission spectra of a narrow-spectrum $K_2SiF_6$:$Mn^{4+}$ red phosphor that may be included in semiconductor light emitting devices according to embodiments of the present invention. In FIG. 7, the dotted line represents the excitation spectrum and the solid line represents the emission spectrum of the $K_2SiF_6$:$Mn^{4+}$ phosphor.

As shown in FIG. 7, the $K_2SiF_6$:$Mn^{4+}$ phosphor may be excited by light in two excitation wavelength ranges, namely a first range in the ultraviolet color range that has a peak excitation at about 355 nanometers, and a second range in the blue color range that has a peak excitation at about 455 nanometers. The excitation is stronger in the blue color range, meaning that, for a blue light excitation source, less phosphor is required to achieve the same amount of red light emission as compared to a corresponding ultraviolet light excitation source.

As is also shown in FIG. 7, the $K_2SiF_6$:$Mn^{4+}$ phosphor has a somewhat unique emission spectrum, with the phosphor emitting light in the red color range with as many as five distinct peaks in the emission spectrum that are located at about 610, 615, 635, 640 and 650 nanometers. The peaks at about 610 and 640 nanometers are within the larger peaks at about 615 and 635 nanometers, respectively. As can be seen in FIG. 7, the peaks are very small, with FWHM widths of about 2-15 nanometers.

It should be noted that characteristics of an emission spectrum such as "peak wavelength" and "FWHM width" may need special definitions in the context of luminescent materials that include multiple emission peaks such as the emission spectrum shown in FIG. 7. For purposes of this disclosure, the peak wavelength of a multi-peak emission spectrum is the wavelength where the highest amount of radiant flux is output (e.g., about 634 nanometers in the emission spectrum of FIG. 7), and the FWHM width of the emission spectrum is defined as the distance (in nanometers) between the wavelength defining the lower boundary of the FWHM width of the individual peak having the lowest peak wavelength and the wavelength defining the upper boundary of the FWHM width of the individual peak having the highest peak wavelength. For example, in the context of the $K_2SiF_6$:$Mn^{4+}$ phosphor having the emission spectrum shown in FIG. 7, the individual peak having the lowest peak wavelength has a peak wavelength of 615 nanometers and a FWHM width of 13 nanometers; thus the wavelength defining the lower boundary of the FWHM width of the individual peak having the lowest peak wavelength is 608 nanometers. Likewise, the individual peak having the highest peak wavelength has a peak wavelength of 650 nanometers and a FWHM width of 5 nanometers; thus the wavelength defining the upper boundary of the FWHM width of the individual peak having the highest peak wavelength is 653 nanometers. The FWHM width of the phosphor is the difference between these two wavelengths, or 45 nanometers.

While in the above-described embodiments, the fourth narrow-spectrum red luminescent material comprises an $A_2MF_6$:$Mn^{4+}$ phosphor where A is an Alkali metal and M is an element with a 4+ valence (e.g., a $K_2SiF_6$:$Mn^{4+}$ phosphor), it will be appreciated that in other embodiments different narrow-spectrum red luminescent materials may be used. Examples of potentially suitable narrow-spectrum red luminescent materials include Cd(Se,S) quantum dots, Zn(Se,S) quantum dots, $AeLiAl_3N_4$:$Eu^{2+}$ phosphors or $SrMg_3SiN_4$:$Eu^{2+}$ phosphors, where Ae is an alkaline-earth element such as calcium or strontium. Likewise, according to further embodiments of the present invention, one or both of the above-described $(Ca_{1-x}Sr_x)SiAlN_3$:$Eu^{2+}$ phosphors may be replaced with other broad-spectrum red luminescent materials such as, for example, a $Y_2O_3$:$Eu^{3+}$ phosphor, a $Y_2O_2S$:$Eu^{3+}$ phosphor, a $(Y,Bi)VO_4$:$Eu^{3+}$ phosphor, a $Lu_2O_3$:$Eu^{3+}$ phosphor, a $(Sr_{2-x}La_x)(Ce_{1-x}Eu_x)O_4$ phosphor, an $Sr_2Ce_{1-x}Eu_xO_4$ phosphor, an $Sr_{2-x}Eu_xCeO_4$ phosphor, an $SrTiO_3$:$Pr^{3+},Ga^{3+}$ phosphor and/or an $Sr_2Si_5N_8$:$Eu^{2+}$ phosphor. Additionally, one of the two broad-spectrum red phosphors could be replaced with a narrow-spectrum red phosphor in some embodiments. While the green broad-spectrum luminescent material has primarily been discussed above with respect to LuAG:Ce, other suitable green light emitting broad-spectrum luminescent materials may be used including, for example, a gallium-substituted YAG:Ce phosphor $(Y_aAl_bGa_cO_2$:Ce$)$, an $Sr_6P_5BO_{20}$:Eu phosphor, a $MSi_2O_2N_2$:$Eu^{2+}$ phosphor and/or a Zinc Sulfide:Ag with (Zn,Cd)S:Cu:Al phosphor, or other combinations. A narrow-spectrum green phosphor could be used in place of the LuAG:Ce phosphor in some embodiments.

While the above-described embodiments of the present invention use a narrow-spectrum red luminescent material to provide semiconductor light emitting devices having, for example, improved lumens/Watt performance for a generally fixed CRI value, it will be appreciated that additional narrow-spectrum luminescent materials may be added to the recipient luminophoric medium that emit light in other color ranges. By way of example, pursuant to further embodiments of the present invention, any of the above-described semiconductor light emitting devices may be modified to further include a narrow-spectrum luminescent material that emits light in, for example, the cyan or green color ranges. The inclusion of one or more such additional narrow-spectrum luminescent materials in color ranges other than the red color range may, for example, provide semiconductor light emitting devices having improved CRI values. It will also be appreciated that any of the above-described semiconductor light emitting devices may be modified to further include additional broad-spectrum luminescent materials in the recipient luminophoric medium such as, for example, a broad-spectrum yellow phosphor.

FIGS. 8A-8D are cross-sectional diagrams illustrating example semiconductor light emitting devices according to embodiments of the present invention that include recipient luminophoric mediums having one or more narrow-spectrum luminescent materials.

Figure 8A:
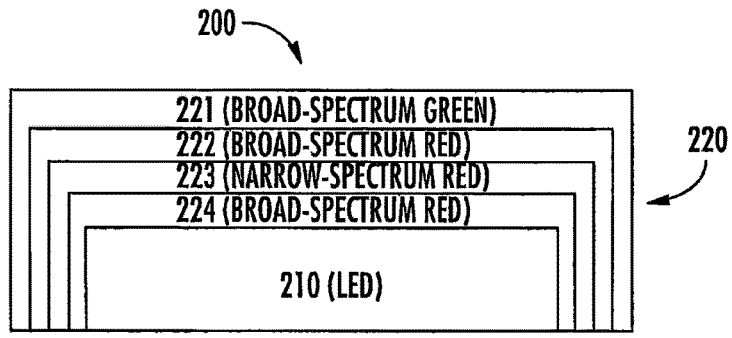
FIGS. 8A-8D are schematic diagrams illustrating various semiconductor light emitting devices according to embodiments of the present invention.

FIG. 8A illustrates a first semiconductor light emitting device 200 that includes an LED 210 and a recipient luminophoric medium 220. The LED 210 included in device 200 would typically be a blue LED, although violet, ultraviolet or other LEDs could be used. As shown in FIG. 8A, the recipient luminophoric medium 220 is arranged to receive light emitted by the LED 210 including, for example, light emitted from the sides and top of the LED 210. The recipient luminophoric medium 220 includes (1) a first broad-spectrum luminescent material 221 that down-converts radiation emitted by the LED 210 to radiation having a peak wavelength in the green color range, (2) a second broad-spectrum luminescent material 222 that down-converts radiation emitted by the LED 210 to radiation having a peak wavelength in the red color range, (3) a fourth narrow-spectrum luminescent material 223 that down-converts radiation emitted by the LED 210 to radiation having a peak wavelength in the red color range, and (4) a third broad-spectrum luminescent material 224 that down-converts radiation emitted by the LED 210 to radiation having a peak wavelength in the red color range. The semiconductor light emitting device 200 is similar to the semiconductor light emitting device 100 discussed above with reference to FIGS. 4-5, with the only difference being that the positions of the third broad-spectrum red luminescent material 123/224 and the fourth narrow-spectrum luminescent material 124/223 are in reversed in the respective recipient luminophoric mediums 120/220.

Figure 8B:
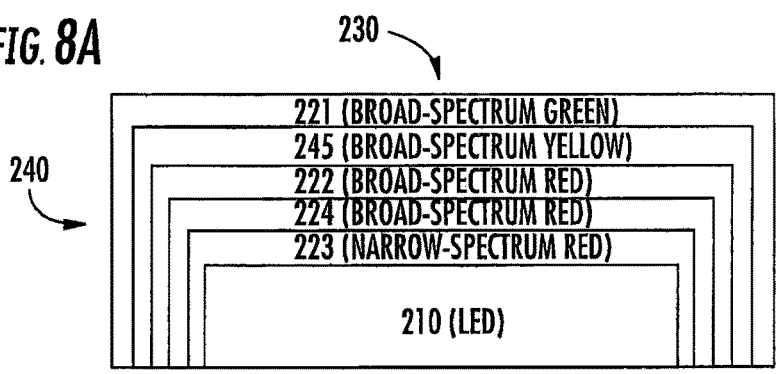

FIG. 8B illustrates another semiconductor light emitting device 230 that includes the LED 210 and a recipient luminophoric medium 240. The recipient luminophoric medium 240 is arranged to receive light emitted by the LED 210. The recipient luminophoric medium 240 includes the same four luminescent materials 221-224 as the recipient luminophoric medium 220 of LED 200, and additionally includes one additional luminescent material in the form of a fifth broad spectrum yellow luminescent material such as, for example, a $Y_3Al_5O_{12}$:Ce phosphor (which may be referred to herein as a YAG:Ce phosphor). In the particular embodiment of FIG. 8B, the fifth yellow broad-spectrum luminescent material 245 is included in a separate layer between the first broad-spectrum green luminescent material 221 and the second broad-spectrum red luminescent material 222.

Figure 8C:
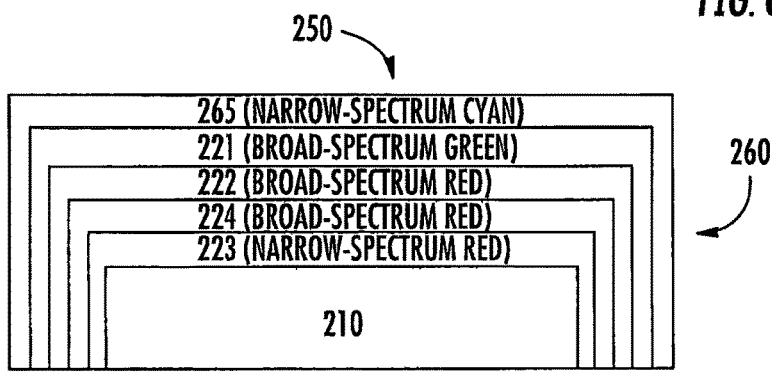

FIG. 8C illustrates another semiconductor light emitting device 250 that includes the LED 210 and a recipient luminophoric medium 260. The recipient luminophoric medium 260 is arranged to receive light emitted by the LED 210. The recipient luminophoric medium 260 includes the same four luminescent materials 221-224 as the recipient luminophoric medium 220 of LED 200, and additionally includes one additional luminescent material in the form of a fifth narrow-spectrum cyan luminescent material 265 such as, for example, a $Ba_2Si_2O_2N_2$:$Eu^{2+}$ phosphor or an $(Sr,Ba,Ca)_2SiO_4$:$Eu^{2+}$ phosphor. In the particular embodiment of FIG. 8C, the fifth narrow-spectrum cyan luminescent material 265 is included in a separate layer that is the farthest layer in the recipient luminophoric medium 260 from the LED 210. The fifth narrow-spectrum cyan luminescent material 265 may provide a device having an improved CRI value, as it may emit light that fills in a gap in the emission spectrum between the blue peak generated by the blue LED 210 and the green peak generated by the first broad-spectrum green phosphor 221.

Figure 8D:
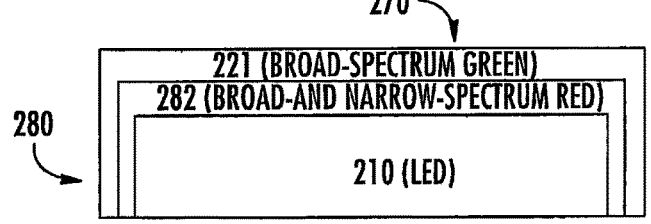

It will be appreciated that FIGS. 8A-8C are not intended to be limiting. For example, while the recipient luminophoric mediums depicted in FIGS. 8A-8C are shown as comprising multi-layer recipient luminophoric mediums with each different phosphor included in its own layer, it will be appreciated that single layer recipient luminophoric mediums may be used instead in which all of the phosphors (or other luminescent materials) are mixed within the same layer or coating. Additionally, as shown in FIG. 8D, in other embodiments subsets of the various luminescent materials may be mixed in one or more layers of a multi-layer recipient luminophoric medium. In the example of FIG. 8D, a semiconductor light emitting device 270 is provided that includes the LED 210 and a recipient luminophoric medium 280. The recipient luminophoric medium 280 is a two layer recipient luminophoric medium in which the first broad-spectrum green luminescent material 221 is included in its own layer and the second broad-spectrum red luminescent material, the third broad-spectrum red luminescent material and the fourth narrow-spectrum red luminescent material are mixed together in a second layer 282. It will be appreciated that numerous other variations are possible.

It will also be appreciated that other changes may be made to the semiconductor light emitting devices 200, 230, 250, 270 of FIGS. 8A-8D. For example, in other embodiments, one or more of the layers of the recipient luminophoric mediums may not extend to surround side surfaces of the LEDs 210, and may not even cover an entire top (or other) surface of the LEDs 210. As another example, the recipient luminophoric mediums need not be coated directly on the respective LEDs 210, but instead need only be arranged to receive light emitted by their respective LEDs 210. Additional broad-spectrum luminescent material(s) and/or narrow-spectrum luminescent material(s) may also be included in the depicted semiconductor light emitting devices.

The above-described recipient luminophoric mediums that include a green and/or yellow phosphor, two broad-spectrum red phosphors and a narrow-band spectrum red phosphor having a peak wavelength that is between the peak wavelengths of the two broad-spectrum red phosphors is a non-conventional approach that provides unexpected results. As explained, for example, in the above-described '875 patent, the use of narrow-spectrum luminescent materials has been suggested as a means of filling in gaps in the spectrum such as, for example, a gap that may appear between the peak emission wavelength of a yellow phosphor and the peak emission wavelength of a broad-spectrum red phosphor. However, the use of such a narrow-spectrum red phosphor would not appear to be needed in a recipient luminophoric medium that included two broad-spectrum red phosphors that have relatively close peak wavelengths (i.e., peak wavelengths within a 35 nanometer range), as there would be little if any dip in the spectral output of such a recipient luminophoric medium in the region between the two peak wavelengths (in fact, as shown in FIG. 3, the peak wavelength of the light output by such a semiconductor light emitting device may be between the peak wavelengths of the two broad-spectrum red phosphors). However, it has been discovered by the present inventors that including a narrow-spectrum red phosphor in this region may actually provide significantly improved performance in terms of the luminous flux that is achieved for a given CRI performance level. Such a result is non-intuitive as the spectrum of light emitting devices according to embodiments of the present invention may concentrate output power at wavelengths that are reasonably far down the eye sensitivity curve. However, by further decreasing the output power at even longer wavelengths and by also increasing the output power in the central portion of the eye sensitivity curve (e.g., by increasing the amount of the second broad-spectrum red phosphor that has the lower peak wavelength), improved performance may unexpectedly be achieved.

In some embodiments, the recipient luminophoric medium may include two broad-spectrum red luminescent materials that have peak wavelengths that are within 40 nanometers of each other. The recipient luminophoric medium may further include a narrow-spectrum red luminescent material that has a peak wavelength that is between the peak wavelengths of the two broad-spectrum luminescent materials. In some embodiments, the two broad-spectrum red luminescent materials may have peak wavelengths that are within 35 nanometers of each other, 30 nanometers of each other, 25 nanometers of each other, or even 20 nanometers of each other. In each case, the narrow-spectrum red luminescent material may have a peak wavelength that is between the peak wavelengths of the two broad-spectrum luminescent materials.

In some embodiments, the two broad-spectrum red luminescent materials may have a combined spectral output that has a peak wavelength that is in the red color range. In some of these embodiments, the narrow-spectrum red luminescent material may have a peak wavelength that is within 20 nanometers of the peak wavelength of the combined spectral output of the two broad-spectrum red luminescent materials. In other embodiments, the narrow-spectrum red luminescent material may have a peak wavelength that is within 15 nanometers of the peak wavelength of the combined spectral output of the two broad-spectrum red luminescent materials. In still other embodiments, the narrow-spectrum red luminescent material may have a peak wavelength that is within 10 nanometers of the peak wavelength of the combined spectral output of the two broad-spectrum red luminescent materials.

In some embodiments, a semiconductor light emitting device is provided that includes one or more LEDs and a recipient luminophoric medium that has a first luminescent material that emits light having a peak wavelength in the green or yellow color ranges, and second, third and fourth luminescent materials that emit light having peak wavelengths in the red color range, where the peak wavelength of the light emitted by the fourth luminescent material is between the peak wavelengths of the light emitted by the second and third luminescent materials. An emission spectrum of the semiconductor light emitting device includes a first peak at the peak wavelength of the fourth luminescent material that is at least 50% greater than (i.e., 1.5 times as high as) any point in the emission spectrum in the green or yellow color ranges. In some embodiments, an emission spectrum of the semiconductor light emitting device may include a first peak at the peak wavelength of the third luminescent material that is at least 1.75 times as high, twice as high, or even three times as high as any point in the emission spectrum in the green or yellow color ranges.

In some embodiments, the narrow-spectrum luminescent material may have an emission spectrum that includes multiple peaks.

While the above examples describe using the recipient luminophoric mediums according to embodiments of the present invention to fabricate warm white light emitting devices (e.g., color temperatures of 2500K to 3300K), it will be appreciated that they can likewise be used to fabricate white light emitting devices that have other color temperatures including, for example, white light emitting devices having correlated color temperatures of between 3300K and 5500K.

It will be appreciated that various modifications may be made to the above-described semiconductor light emitting devices and associated recipient luminophoric mediums without departing from the teachings of the present invention. For example, while the above-described embodiments may provide excellent CRI performance, in some applications, lower CRI performance (e.g., a CRI of at least 80) may be fully acceptable. In such applications, it may be possible to adjust the phosphor combination to increase the luminous flux of the semiconductor light emitting device at the expense of reduced CRI performance.

In one example embodiment, a semiconductor light emitting device may be provided that includes one or more LEDs (e.g., a blue LED that emits light having a peak wavelength between 440 and 470 nanometers) and a recipient luminophoric medium that includes first through fourth luminescent materials. This semiconductor light emitting device may have, for example, the design of the semiconductor light emitting device 100 of FIG. 4 that is discussed above except that the luminescent materials included in the recipient luminophoric medium 120 are modified as discussed below.

In particular, in this modified version of the semiconductor light emitting device 100 of FIG. 4, the recipient luminophoric medium may include a first luminescent material in the form of a LuAG:Ce phosphor, a second luminescent material in the form of a first $(Ca_{1-x}Sr_x)SiAlN_3:Eu^{2+}$ phosphor that has calcium and strontium concentrations that are selected so that the phosphor emits light in response to the blue LED having a peak wavelength between 610 and 620 nanometers (e.g., a peak wavelength of 614 nanometers), a third luminescent material in the form of a second $(Ca_{1-x}Sr_x)SiAlN_3:Eu^{2+}$ phosphor that has a higher calcium concentration and a lower strontium concentration than the first $(Ca_{1-x}Sr_x)SiAlN_3:Eu^{2+}$ phosphor so that the second $(Ca_{1-x}Sr_x)SiAlN_3:Eu^{2+}$ phosphor emits light in response to the blue LED having a peak wavelength between 621 and 630 nanometers (e.g., a peak wavelength of 624 nanometers), and a fourth luminescent material in the form of an $A_2MF_6$:$Mn^{4+}$ phosphor where A is an Alkali metal and M is an element with a 4+ valence (e.g., a $K_2SiF_6:Mn^{4+}$ phosphor having a peak wavelength of 634 nm).

In some embodiments, the second and third luminescent materials may have peak wavelengths that are within 20 nanometers of each other. In other embodiments, the second and third luminescent materials may have peak wavelengths that are within 15 nanometers of each other. In still other embodiments (such as the specific embodiment discussed above where the second and third luminescent materials are $(Ca_{1-x}Sr_x)SiAlN_3:Eu^{2+}$ phosphors having peak wavelengths of 614 and 624 nanometers), the second and third luminescent materials may have peak wavelengths that are within 10 nanometers of each other. In each of the above-described embodiments, the fourth luminescent material may have a peak wavelength that is within 15 nanometers of the peak wavelength of the third luminescent material. In some cases (such as the specific embodiment discussed above where the third luminescent material has a peak wavelength of 624 nanometers and the fourth luminescent material has a peak wavelength of 634 nanometers), the fourth luminescent material may have a peak wavelength that is within 10 nanometers of the peak wavelength of the third luminescent material. In some embodiments, the peak wavelength of the fourth luminescent material may be between the peak wavelengths of the second and third luminescent materials, while in other embodiments the peak wavelength of the fourth luminescent material may exceed the peak wavelengths of both the second and third luminescent materials.

In specific example embodiments of the above-described recipient luminophoric mediums, a ratio of the first luminescent material to the second, third and fourth luminescent materials by weight may be between 2:1 and 3:1, and a ratio of the second and third luminescent materials to the fourth luminescent material by weight may be between 1:2 and 1:4. A ratio of the second luminescent material to the third luminescent material by weight may be between 1:1 and 1:3. A ratio of the first luminescent material to the second luminescent material by weight may be between 1:4 and 1:3, and the ratio of the first and the second luminescent materials to the third luminescent material maybe between 12:1 and 14:1.

Figure 14:
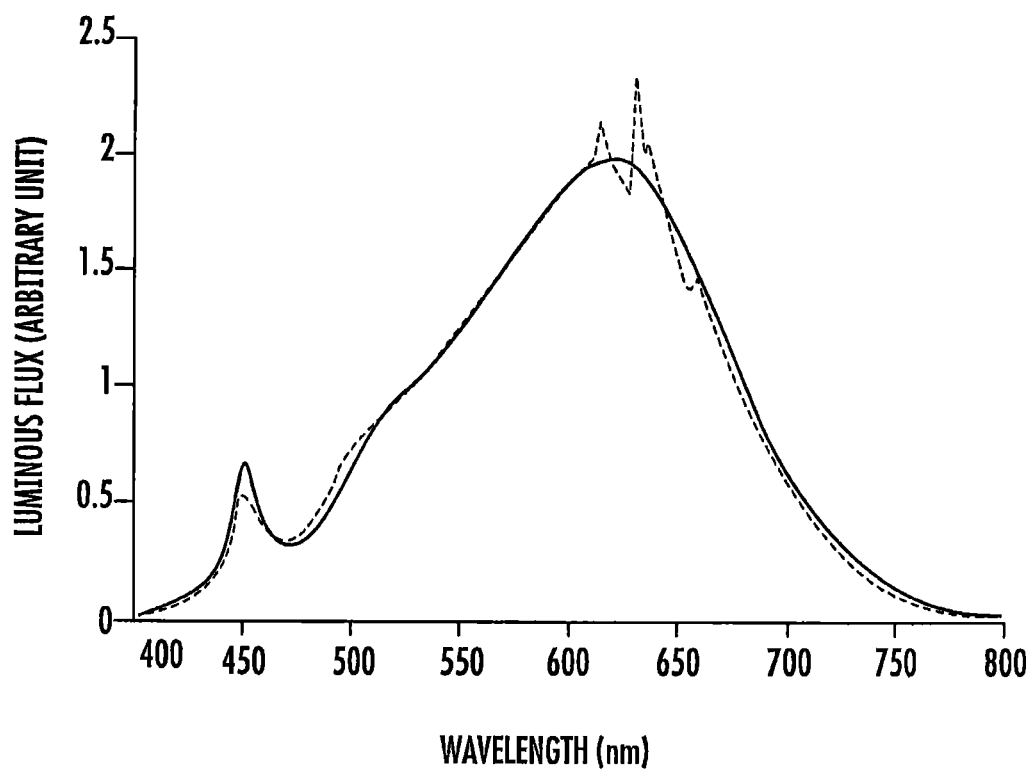
FIG. 14 is a graph illustrating the emission spectra of a semiconductor light emitting device according to further embodiments of the present invention as compared to the emission spectrum for a conventional semiconductor light emitting device.

The above-described semiconductor light emitting device may be designed to have CRI values of, for example, at least 80. These semiconductor light emitting devices may exhibit higher luminous flux values as compared to a state-of-the-art conventional 80 CRI semiconductor light emitting device (specifically a semiconductor light emitting device having a recipient luminophoric medium that includes a LuAG:Ce phosphor (having a peak wavelength of 535 nanometers, a YAG:Ce phosphor having a peak wavelength of 557 nm, and a red phosphor having a peak wavelength of 629 nanometers). The above-described semiconductor light emitting device may exhibit lower CRI R9 values (e.g., by between 3 to 5 units) than the CRI R9 values for the state-of-the-art conventional 80 CRI semiconductor light emitting device. FIG. 14 depicts the emission spectrum for the above-described semiconductor light emitting device according to embodiments of the present invention (shown with the dotted line) as compared to the emission spectrum of the above described state-of-the-art conventional 80 CRI semiconductor light emitting device (shown with the solid line).

Figure 9:
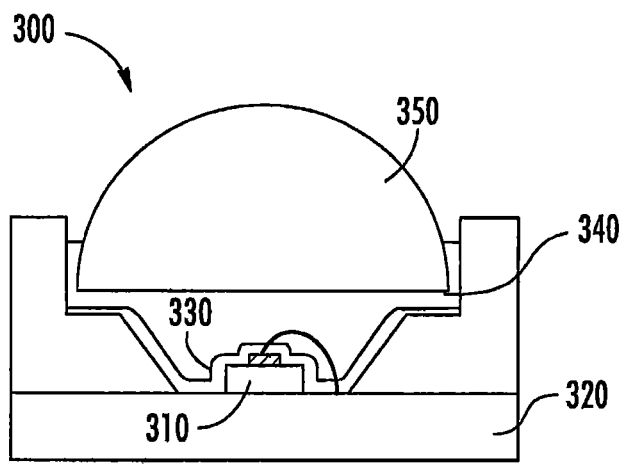
FIG. 9 is a cross-sectional view of a semiconductor light emitting device according to further embodiments of the present invention.

A semiconductor light emitting device will now be described that includes a recipient luminophoric medium according to embodiments of the present invention with reference to FIG. 9. In particular, FIG. 9 is a side schematic view of a light emitting device 300 that includes an LED 310 that is mounted on a mounting surface 320. The LED 310 may comprise, for example, an LED that emits radiation having a dominant wavelength in the blue color range (e.g., radiation with a dominant wavelength of between 440 to 475 nanometers). A recipient luminophoric medium 330 is provided that is positioned to receive light that is emitted by the LED 310. The luminophoric medium 330 may comprise an encapsulant material such as, for example, silicone that has luminescent materials suspended therein. In the embodiment pictured in FIG. 9, the recipient luminophoric medium 330 is conformally coated on an upper and side surfaces of the LED 310 and on the mounting surface 320 and sidewalls of a reflector cup. It will be appreciated, however, that the recipient luminophoric medium 330 may be placed in other locations. For example, in other embodiments, the recipient luminophoric medium 330 may be coated on an interior and/or exterior surface of a lens 350, embodied as an encapsulant material 340 that is provided between the LED 310 and the lens 350 or in any other suitable location where the recipient luminophoric medium 330 may receive at least some of the light emitted by the LED 310 and convert at least some of the emitted light to light having different wavelengths. The recipient luminophoric medium 330 may be any of the above-described recipient luminophoric mediums according to embodiments of the present invention. The blue LED 310 is shown as having a topside contact, but may comprise a flip-chip LED in other embodiments.

Figure 10:
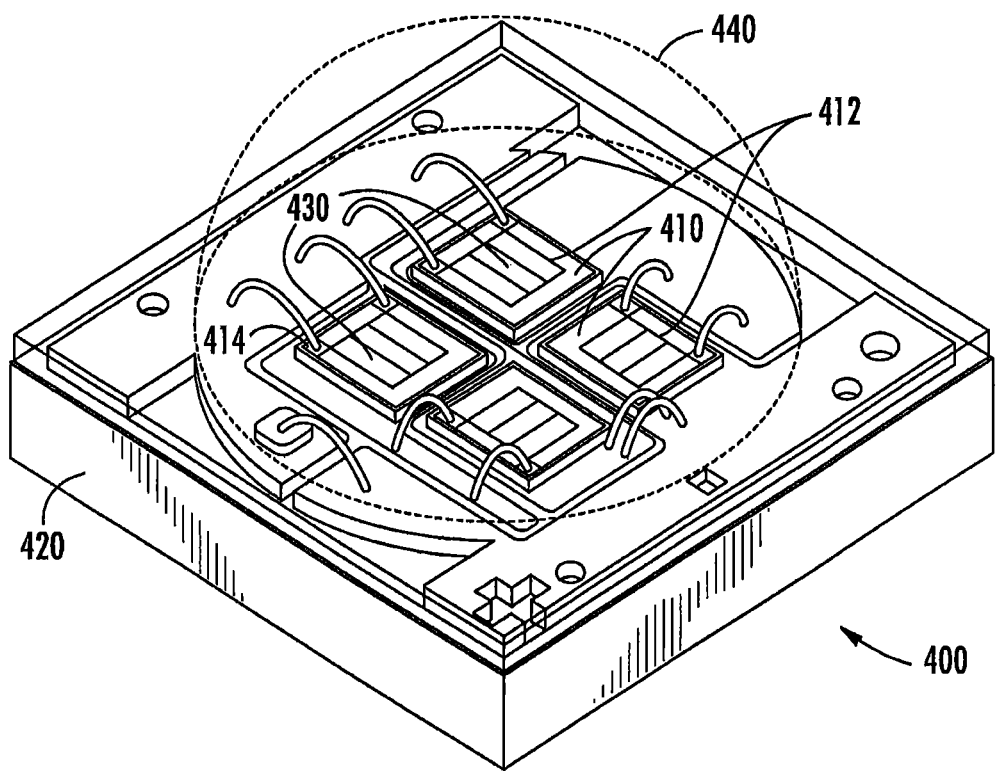
FIG. 10 is a perspective view of a semiconductor light emitting device according to embodiments of the present invention.

FIG. 10 is a perspective view of a semiconductor light emitting device 400 according to further embodiments of the present invention. As shown in FIG. 10, the solid state light emitting device 400 includes a substrate/submount ("submount") 420 on which four LED chips or "die" 410 are mounted. The submount 420 can be formed of many different materials such as, for example, aluminum oxide, aluminum nitride, organic insulators, a printed circuit board (PCB), sapphire or silicon. The LEDs 410 can have many different semiconductor layers arranged in different ways. LED structures and their fabrication and operation are generally known in the art and hence are only briefly discussed herein. The layers of the LEDs 410 can be fabricated using known processes such as, for example, metal organic chemical vapor deposition. Typically, LEDs are grown on a growth substrate such as, for example, a sapphire, silicon carbide, aluminum nitride (AlN), or gallium nitride (GaN) substrate to provide a grown semiconductor wafer, and this wafer is then singulated into individual LED dies 410. The growth substrate can remain as part of the final singulated LED or, alternatively, the growth substrate can be fully or partially removed. In embodiments where the growth substrate remains, it can be shaped and/or textured to enhance light extraction. The LEDs 410 may be mounted in flip chip configuration in some embodiments.

The LEDs 410 may each include a conductive current spreading structure 412 on the respective top surfaces thereof, as well as one or more contacts 414 that are accessible at its top surface for wire bonding. In other embodiments, one or both contacts 414 for each LED 410 may be on a bottom side of the LED. The current spreading structure 412 and contacts 414 can both be made of a conductive material such as Au, Cu, Ni, In, Al, Ag or combinations thereof, conducting oxides and transparent conducting oxides. The current spreading structure 412 may comprise conductive fingers that are arranged in a pattern on each LED 410 with the fingers spaced to enhance current spreading from the contacts 414 into the top surface of the LEDs 410. In operation, an electrical signal is applied to the contacts 414 through a wire bond, and the electrical signal spreads through the fingers of the current spreading structure 412 into the LED 410.

The LEDs 410 may be coated with a recipient luminophoric medium 430 according to embodiments of the present invention. As discussed above, this recipient luminophoric medium 430 may, for example, include a first broad-spectrum green luminescent material, second and third broad-spectrum red luminescent materials, and a fourth narrow spectrum red luminescent material, which may be mixed together and/or provided in separate layers). It will be understood that the recipient luminophoric medium 430 may comprise any of the recipient luminophoric mediums discussed in the present application. The recipient luminophoric medium may be coated on the two LEDS 410, and may also be coated on portions of the submount 420 such as, for example, portions between the LEDs 410.

The recipient luminophoric medium 430 may include a binder material, and may have different concentrations or loading of phosphor materials in the binder, with a typical concentration being in range of 40-80% by weight. In one embodiment, the phosphor concentration is approximately 75% by weight, and may be generally uniformly dispersed throughout the binder. In other embodiments the recipient luminophoric medium 430 can comprise multiple layers of different concentrations or types of phosphors (or other luminescent materials), and the multiple layers can comprise different binder materials. One or more of the layers can be provided without phosphors. For example, a first coat of clear silicone can be deposited followed by phosphor loaded layers.

The recipient luminophoric medium 430 may be coated on the LEDs 410 using many different methods. For example, in some embodiments, the recipient luminophoric medium 430 may be applied to semiconductor LED wafers during the LED manufacturing process. Suitable methods for such wafer level deposition are described in U.S. Patent Publication Nos. 2008/0173884 and 2008/0179611, both entitled Wafer Level Phosphor Coating Method and Devices Fabricated Utilizing Method. Alternatively the recipient luminophoric medium 430 may be coated on the LEDs 410 using other methods such an electrophoretic deposition (EPD), with a suitable EPD method described in U.S. Patent Publication No. 2007/0158668 entitled Close Loop Electrophoretic Deposition of Semiconductor Devices. In still other embodiments, the recipient luminophoric medium 430 may be sprayed or otherwise applied to the LEDs 410 after the LEDs 410 have been singulated and mounted on the mounting substrate 420. Numerous other techniques are known in the art and are suitable for applying the recipient luminophoric mediums according to embodiments of the present invention.

An optical element or lens 440 is formed over at least part of the top surface of the submount 420 to enclose the LEDs 410 and provide both environmental and/or mechanical protection therefore. The lens 440 can be molded using different molding techniques such as those described in U.S. Patent Publication No. 2009/0108281 entitled Light Emitting Diode Package and Method for Fabricating Same. The lens 440 can be many different shapes such as, for example, hemispheric. Many different materials can be used for the lens 440 such as silicones, plastics, epoxies or glass. The lens 440 can also be textured to improve light extraction. In some embodiments, the lens 440 may comprise the recipient luminophoric medium 430 and/or may be used to hold a luminophoric medium 430 in place over the LEDs 410 instead of and/or in addition to coating a luminophoric medium 430 directly onto the LED chips 410.

The recipient luminophoric mediums according to embodiments of the present invention may also be applied to a light emitting device while the light emitting device is exposed to a curing agent. The curing agent may be, for example, heat, radiation, a material that is present on or in the light emitting device, or other agents that speed up the curing of the recipient luminophoric medium.

Figure 11:
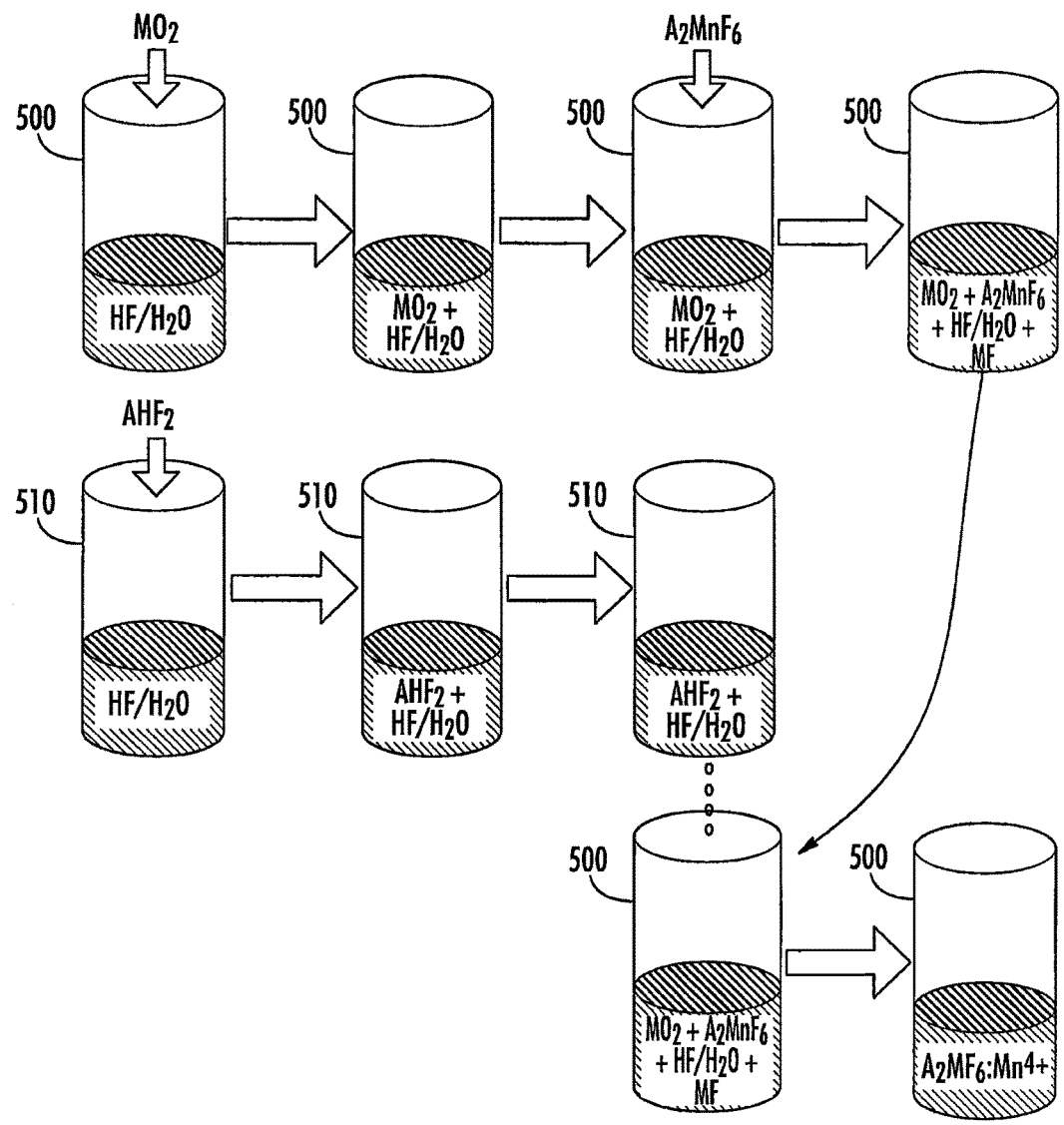
FIG. 11 is a schematic diagram that illustrates a method of synthesizing a narrow-spectrum red phosphor according to embodiments of the present invention.

Pursuant to further embodiments of the present invention, methods of synthesizing narrow-spectrum red phosphors are provided, as well as related methods of fabricating light emitting devices that include such phosphors. FIG. 11 is a schematic diagram that illustrates certain of these methods according to embodiments of the present invention.

As shown in FIG. 11, the method may begin by dissolving $MO_2$ powder, which is commercially available for purchase, in a hydrofluoric acid (HF) solution in a first container 500. M may comprise any of Si, Ge, Sn, Ti, Zr or Hf. In some embodiments, M may be Si. The hydrofluoric acid solution may comprise, for example, a solution including 49% hydrofluoric acid and 51% water ($HF/H_2O$). The $MO_2$ powder may be dissolved in the hydrofluoric acid solution until no visible solids remain. In some embodiments, this may require dissolving the $MO_2$ powder for at least four hours in the hydrofluoric acid solution.

Next, an appropriate amount of $A_2MnF_6$ powder is added to the solution comprising $MO_2$ dissolved in the hydrofluoric acid solution. A may comprise an Alkali metal such as, for example, potassium (K). The $A_2MnF_6$ powder is dissolved in the solution and thoroughly mixed to provide an $MO_2+A_2Mn_6F_2+HF/H_2O+MF$ solution.

In a second container 510, $AHF_2$ is dissolved in another hydrofluoric acid solution that may comprise, for example, 49% hydrofluoric acid and 51% water, where A is the same Alkali metal (e.g., K) to provide an $AHF_2+HF/H_2O$ solution. Next, the resulting $AHF_2+HF/H_2O$ solution is then added to the $MO_2+A_2Mn_6F_2+HF/H_2O+MF$ solution in the first container 500. The $AHF_2+HF/H_2O$ solution may be added in a dropwise fashion, and may be added at an elevated temperature. For example, in some embodiments, the $AHF_2+HF/H_2O$ solution may be added to the $MO_2+A_2Mn_6F_2+HF/H_2O+MF$ solution at a temperature of between 40° C. and 90° C. When the two solutions are combined, solid precipitates of $A_2MF_6:Mn^{4+}$ form in the solution. The solution may then be decanted to remove the $A_2MF_6:Mn^{4+}$ precipitates, which may then be washed in methanol. While not pictured in FIG. 11, in other embodiments, the $MO_2+A_2Mn_6F_2+HF/H_2O+MF$ solution in the first container is added dropwise to the $AHF_2+HF/H_2O$ solution instead of the other way around, which may provide improved results in some cases.

Figure 12:
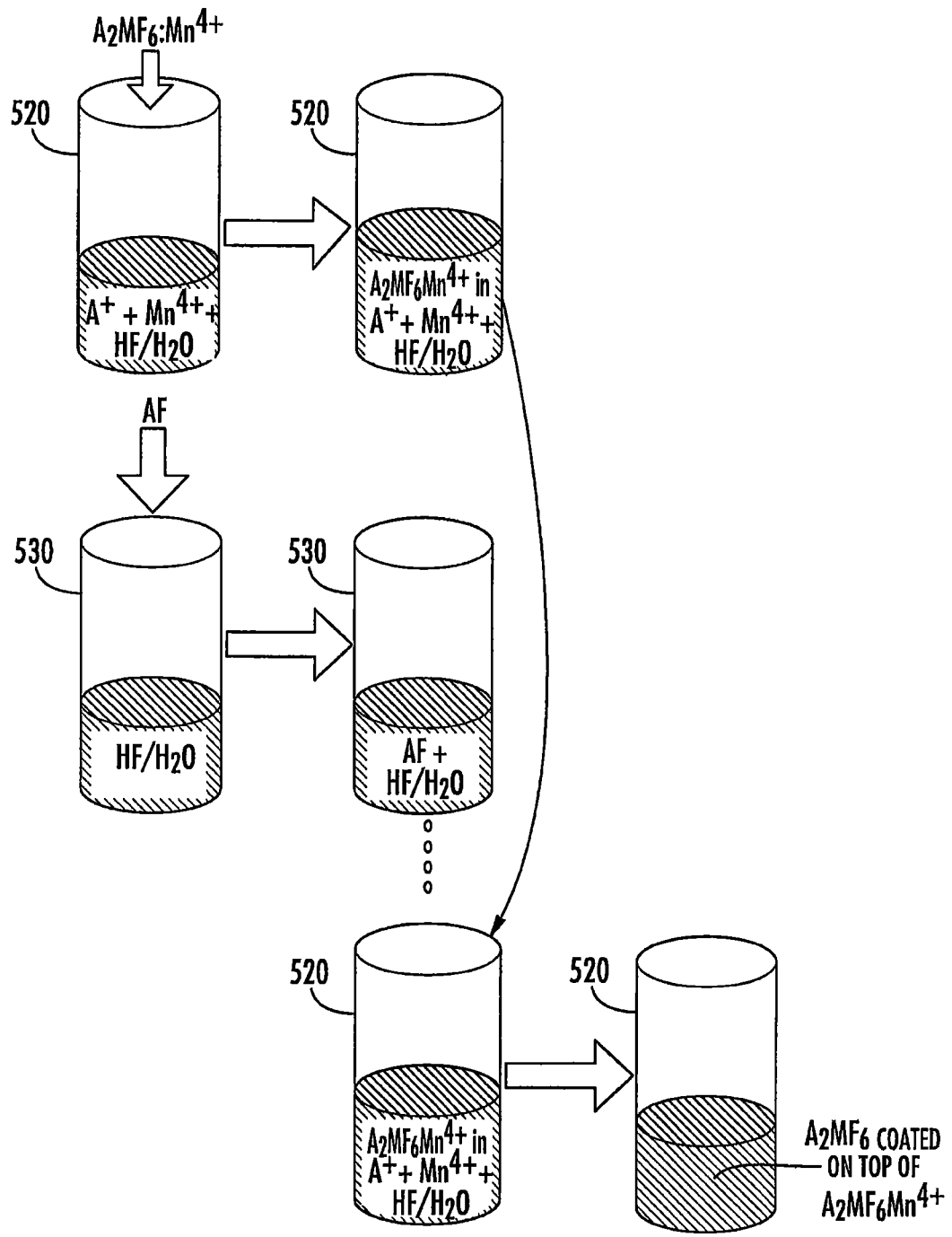
FIG. 12 is a schematic diagram that illustrates additional processing steps that may be performed to improve the stability of a narrow-spectrum red phosphor formed according to the method of FIG. 11.

In some cases, further processing steps may be performed which may, for example, improve the stability of the $A_2MF_6:Mn^{4+}$ phosphor. In particular, as shown in FIG. 12, the synthesized $A_2MF_6:Mn^{4+}$ phosphor precipitates are added to a saturated $A^++M^{4+}+HF/H_2O$ (49% HF) solution in a third container 520. In a fourth container 530, AF is dissolved in another hydrofluoric acid solution that may comprise, for example, 49% hydrofluoric acid and 51% water. The $AF+HF/H_2O$ (49% HF) solution is then added dropwise to the $A^++Mn^{4+}+HF/H_2O$ (49% HF) solution that contains the previously synthesized $A_2MF_6:Mn^{4+}$ phosphor precipitates. This results in a transparent coating of solid $A_2MF_6$ (without any Mn) on top of the $A_2MF_6:Mn^{4+}$ phosphor particles. The solution may then be decanted and the precipitates may be washed in methanol. This method reduces the concentration of $Mn^{4+}$ on the surface of the phosphor particles. This makes the phosphor particles less susceptible to degradation in humid environments.

The above-described method of synthesizing a narrow-spectrum $A_2MF_6:Mn^{4+}$ red phosphor may provide phosphor particles having a high degree of potency. The potency of a phosphor relates to the amount of phosphor that must be provided to achieve a certain amount of emission from the phosphor for a fixed amount of excitation light. The more potent a phosphor, the less the amount of phosphor is required to achieve the desired emission. Generally speaking, high potency is a desirable property for phosphors used in semiconductor light emitting devices, as the smaller number of phosphor particles that may be required with high potency phosphors may reduce absorption and scattering losses.

According to further embodiments of the present invention, semiconductor light emitting devices may be provided that include recipient luminophoric mediums that include a first broad-spectrum green or yellow luminescent material and a fourth narrow-spectrum luminescent material, and one but not both of a second broad-spectrum red luminescent material or a third broad-spectrum red luminescent material. In each such semiconductor light emitting device, the fourth narrow-spectrum red luminescent material may comprise an $A_2MF_6:Mn^{4+}$ red phosphor, where A is an Alkali metal and M is Si, Ge, Sn, Ti, Zr or Hf. As an example, these light emitting devices may have the structure of the semiconductor light emitting device 200 that is shown in FIG. 8A with either the second broad-spectrum red phosphor 222 or the third broad-spectrum red phosphor 223 omitted. In some such embodiments, the peak wavelength of the $A_2MF_6:Mn^{4+}$ red phosphor may be within 26 nanometers of the peak wavelength of the broad-spectrum $(Ca_{1-x}Sr_x)SiAlN_3:Eu^{2+}$ red phosphor that is included in the device.

Figure 13:
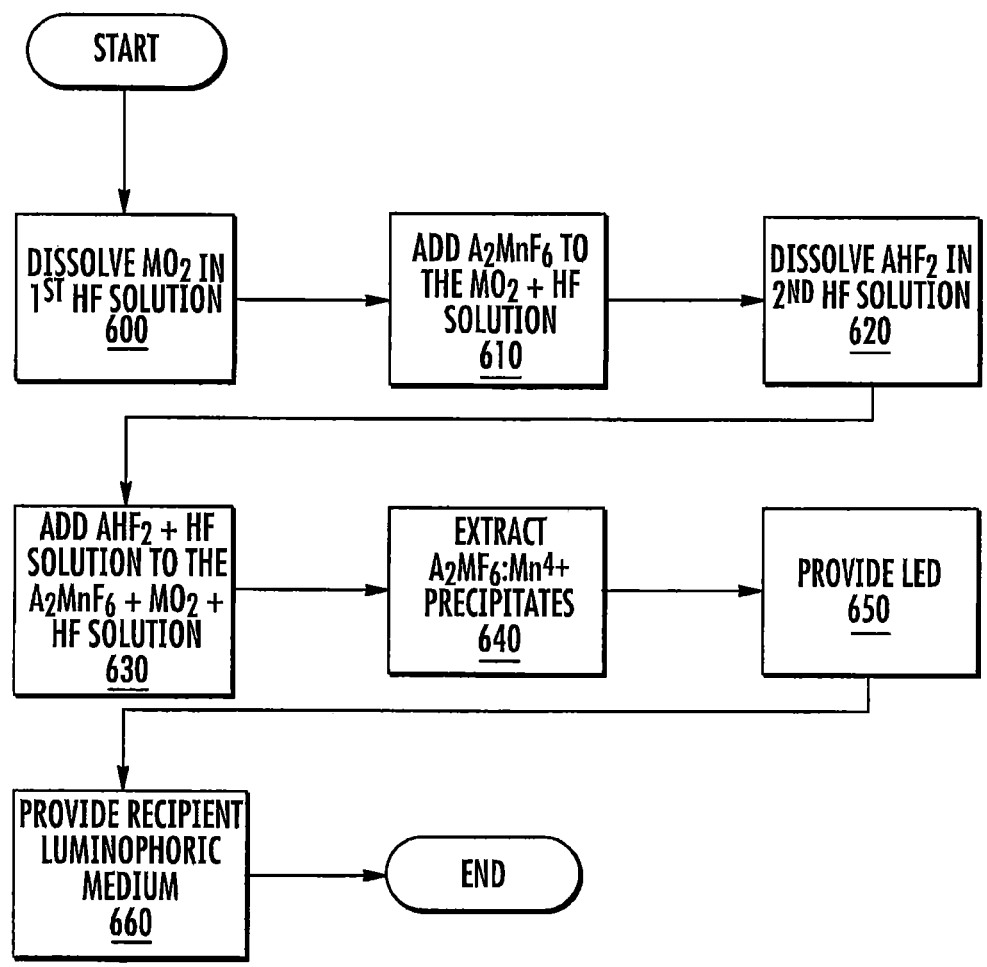
FIG. 13 is a flow chart illustrating a method of providing a semiconductor light emitting device according to further embodiments of the present invention.

Pursuant to still further embodiments of the present invention, methods of forming a semiconductor light emitting device are provided. FIG. 13 is a flow chart illustrating the operations according to some of these methods.

As shown in FIG. 13, operations may begin with synthesizing a narrow-spectrum red phosphor by first dissolving $MO_2$ powder in a first hydrofluoric acid solution to provide an $MO_2+HF$ solution, where M is one or more of Si, Ge, Sn, Ti, Zr or Hf (block 600). Next, dissolved $A_2MnF_6$ is added to the $MO_2+HF$ solution to provide a $A_2MnF_6+MO_2+HF$ solution, where A is an Alkali metal (block 610). $AHF_2$ is dissolved in a second hydrofluoric acid solution to provide an $AHF_2+HF$ solution (block 620). This operation may be done before, after or concurrently with the operations of blocks 600 and/or 610. Next, the $AHF_2+HF$ solution is added to the $A_2MnF_6+MO_2+HF$ solution (block 630). In some embodiments, the $AHF_2+HF$ solution may be added to the $A_2MnF_6+MO_2+HF$ solution at a temperature between 40° C. and 90° C. Next, solid precipitates of $A_2MF_6:Mn^{4+}$ may be extracted from the combination of the $AHF_2+HF$ and the $A_2MnF_6+MO_2+HF$ solutions (block 640).

An LED is also provided (block 650). A recipient luminophoric medium that is configured to down-convert at least some of the light emitted by the LED is also provided (block 660). The recipient luminophoric medium includes (1) a first luminescent material that down-converts a first portion of the radiation emitted by the LED to radiation having a first peak wavelength in the green or yellow color ranges, (2) a second luminescent material that down-converts a second portion of the radiation emitted by the LED to radiation having a second peak wavelength in the red color range, the second luminescent material having a full-width half maximum bandwidth of at least 70 nanometers, (3) a third luminescent material that down-converts a third portion of the radiation emitted by the LED to radiation having a third peak wavelength in the red color range, and (4) a fourth luminescent material that includes the $A_2MF_6:Mn^{4+}$ precipitates, the fourth luminescent material configured to down-convert a fourth portion of the radiation emitted by the LED to radiation having a fourth peak wavelength in the red color range.

In some embodiments, M is silicon (Si) and A is potassium (K). The fourth peak wavelength may be greater than the second peak wavelength and less than the third peak wavelength. The second peak wavelength may be within 30 nanometers of the third peak wavelength. An emission spectrum of the semiconductor light emitting device may include a first peak at the fourth peak wavelength that is at least 50% greater than any point in the emission spectrum in the yellow or green color ranges.

Pursuant to further embodiments of the present invention, semiconductor light emitting devices are provided that emit white light at high luminous flux values that may also have high CRI values, high CRI R9 values, and high color quality. While CRI is often used as a measure of the quality of the color of a white light emitting device, CRI, at least standing alone, may not always provide a satisfactory measure of the color quality. In particular, the eight color samples that are used to calculate CRI are primarily pastel shades, as opposed to saturated colors. As such, light emitting devices that emit light having high CRI values may still fall short in rendering certain hues such as red hues. As it turns out, the red content of a light source may be important for accurately rendering colors of various foods, skin tones, wood, furniture and other objects, as only a few of the color samples used to compute CRI have significant red content (namely sample R1, which is a pink shade, and sample R8, which is a purple shade), and these samples are not saturated color samples so that high CRI scores may be achieved even without significant red content in a light source.

Seven additional color samples labelled CRI R9-R15 have been defined that measure the color rendering of a light source for either saturated colors (R9-R12, corresponding to saturated red, yellow, green and blue light) or for other colors (R13-R15) corresponding to two different skin tones and leaf green. These color samples are not used in calculating CRI, which is based solely on color samples R1-R8, but may be important when evaluating the color rendering of a particular light source.

Figure 15:
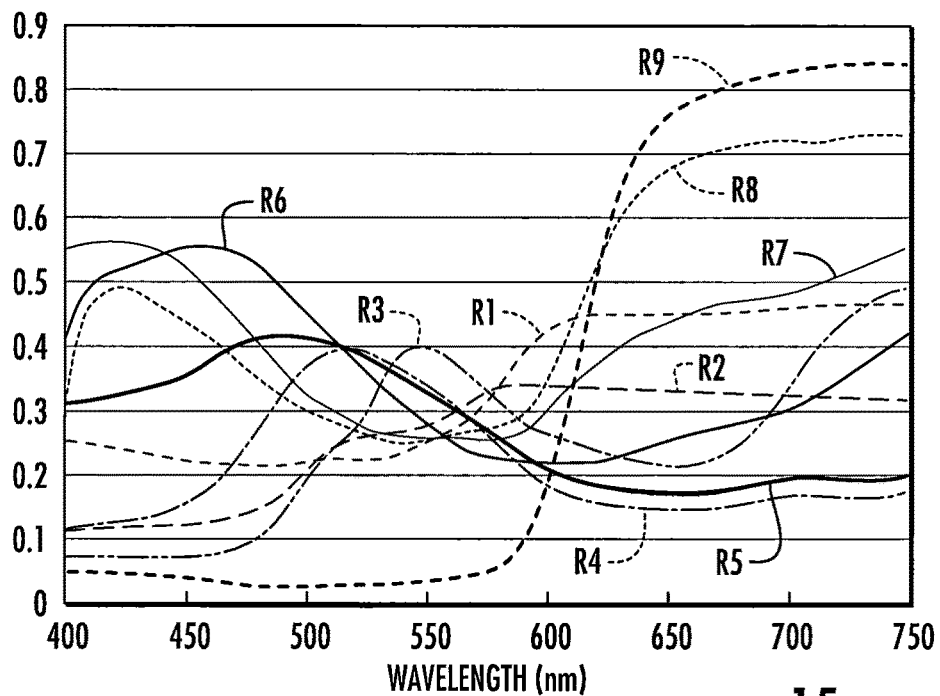
FIG. 15 is a graph illustrating the reflectance spectra for the CRI R1-R9 color samples when illuminated by a reference light source.

As discussed above, of these seven additional color samples, the CRI R9 color sample is often considered the most important, given the prominence of the color red. Since color sample R9 corresponds to a saturated color, there is no way to achieve a high R9 score without a significant red content in the light source. This can be seen in FIG. 15, which shows the reflectance spectra (i.e., reflected power as a function of wavelength) for the R1-R9 color samples when illuminated by a reference light source. As can be seen in FIG. 15, color samples R1-R8 include mixes of many different colors, as shown by the fact that samples R1-R8 have significant contribution across a broad portion of the visible light spectrum, whereas color sample R9 includes very high spectral reflectivity in the red region with virtually no reflectivity below 600 nm. Thus, the R9 color sample may provide a very good indicator of a light source's ability to accurately render the color of red objects, and for this reason is often considered along with CRI in evaluating the quality of the color of a light source.

In addition, CRI also confers limited ability to predict color discrimination (i.e., to perceive subtle difference in hue) or color preference. There appears to be a natural human attraction to brighter color. Daylight provides a spectrum of light that allows the human eye to perceive bright and vivid colors, which allows a human observer to distinguish objects having even very subtle color shade differences. Accordingly, it is generally recognized that daylight and blackbody sources are superior to many artificial light sources for emphasizing and distinguishing color. The ability of human vision to differentiate color is different under correlated color temperature conditions providing the same CRI. Such differentiation is proportional to the gamut area of the illuminating light.

The gamut area of a light source can be calculated as the area enclosed within a polygon defined by the chromaticities in CIE 1976 u'v' color space of the eight color samples R1-R8 used to calculate CRI when illuminated by a test light source. Gamut area index (GAI) is a convenient way of characterizing in chromaticity space how saturated the illumination makes objects appear, with a larger GAI making object colors appear more saturated. GAI is a relative number whereby an imaginary equal-energy spectrum (wherein radiant power is equal at all wavelengths) is scored as 100. GAI for a test source is determined by comparing color space area of the light being tested to the color space area produced by the imaginary or theoretical equal-energy spectrum (EES) source. Unlike CRI, which has a maximum value of 100, GAI can exceed 100, meaning that some sources saturate colors more than an equal-energy source saturates color.

Typical blackbody-like light sources and typical daylight-like light sources have different gamut areas. Low correlated color temperature sources (e.g., incandescent emitters) have a GAI of approximately 50% (i.e., about half the gamut area of the EES source). Sources with higher correlated color temperature values have a larger GAI. For example, a very bluish light with a correlated color temperature of 10000K may have a GAI of 140%.

Another way of characterizing how saturated an illuminant makes objects appear is relative gamut area, or "Qg", which is also referred to as the "Color Quality Scale Qg," which is the area formed by (a*, b*) coordinates of the 15 test-color samples R1-R15 normalized by the gamut area of a reference illuminant at the same correlated color temperature and multiplied by 100. In a manner similar to GAI, Qg values can exceed 100; however, Qg values are scaled for consistency relative to correlated color temperature. Because of chromatic adaptation, and because correlated color temperature is selected to set the overall color tone of an environment as part of the lighting design process, variable-reference measures such as Qg may be especially relevant to applied lighting design. If the relative gamut is greater than that of the reference, and illuminance is lower than that provided by daylight, then an increase in preference and discrimination might be expected relative to the reference at that same correlated color temperature. Conversely, if the relative gamut is smaller than that of the reference, then a decrease in preference and discrimination might be expected relative to the reference at the same correlated color temperature.

High Qg values are generally associated with more vivid colors. It is believed that, in at least certain contexts, some consumers may prefer light sources with significantly enhanced vividness. It may, however, be challenging to provide enhanced vividness in combination with high luminous efficacy, and further in combination with reasonably high color rendering index values.

As noted above, semiconductor light emitting devices according to embodiments of the present invention may emit white light at high luminous flux values that may also have high CRI values, high CRI R9 values, and enhanced vividness.

For example, according to some embodiments, semiconductor light emitting devices are provided that include one or more LEDs that emits light in, for example, the blue color range and a recipient luminophoric medium that is configured to receive and down-convert at least some of the light emitted by these LEDs. The recipient luminophoric medium includes at least a first luminescent material that down-converts a first portion of the radiation emitted by the LEDs to radiation having a first peak wavelength that is in the green or yellow color ranges; a second luminescent material that down-converts a second portion of the radiation emitted by the LEDs to radiation having a second peak wavelength that is in the red color range, the second luminescent material having a full-width half maximum bandwidth of at least 70 nanometers; and a third luminescent material that down-converts a third portion of the radiation emitted by the LEDs to radiation having a third peak wavelength that is in the red color range. The third luminescent material may be a narrowband luminescent material. The third peak wavelength is higher than the second peak wavelength, and the third luminescent material has a full-width half maximum bandwidth of less than 60 nanometers. In some embodiments, the third luminescent material may have multiple emission peaks including an emission peak that has a full-width half maximum bandwidth of less than 25 nm. Moreover, the second peak wavelength is within twenty (20) nanometers of the third peak wavelength.

The first luminescent material may be a YAG:Ce phosphor, the second luminescent material may be a $(Ca_{1-x}Sr_x)SiAlN_3:Eu^{2+}$ phosphor, and the third luminescent material may be an $A_2MF_6:Mn^{4+}$ phosphor where A is an Alkali metal and M is an element with a 4+ valence. In some embodiments, the third luminescent material may be a $K_2SiF_6:Mn^{4+}$ phosphor having a peak wavelength between 630 and 640 nm, and the $(Ca_{1-x}Sr_x)SiAlN_3:Eu^{2+}$ phosphor may have a peak wavelength between about 610 and 630 nm. The $(Ca_{1-x}Sr_x)SiAlN_3:Eu^{2+}$ phosphor may have a strontium concentration of at least 0.80 in some embodiments.

The emission spectrum of the semiconductor light emitting device may have a first peak that is attributable to the third luminescent material that is at least 50% greater than any point in the emission spectrum in the yellow or green color ranges (i.e., the luminous flux at the wavelength at which the first peak that is attributable to the third luminescent material is centered may be at least 50% higher than the luminous flux of the semiconductor light emitting device at any other wavelength within the green or yellow color ranges). The third luminescent material may emit light having multiple distinct peaks in the red color range, where a first of the multiple distinct peaks is at a wavelength that is less than a peak wavelength of a spectral output of the second luminescent material in response to the second portion of the radiation emitted by the LEDs, and a second of the multiple distinct peaks is at a wavelength that is greater than the peak wavelength of the spectral output of the second luminescent material in response to the second portion of the radiation emitted by the LEDs. In some embodiments, the peak wavelength of the second luminescent material may be between the two highest of the multiple distinct peaks of the third luminescent material.

A weight of the third luminescent material that is included in the recipient luminophoric medium may be at least one third the total weight of all three of the first and second and third luminescent materials that are included in the recipient luminophoric medium. The light output by the semiconductor light emitting device may have a correlated color temperature of less than 2800° K, a CRI value of at least 80, a CRI R9 value of at least 30, and a Qg value of at least 100.

As another example, according to further embodiments, semiconductor light emitting devices are provided that include one or more LEDs that emit light in the blue color range and a recipient luminophoric medium that is configured to receive and down-convert at least some of the light emitted by the blue LEDs. The recipient luminophoric medium includes at least a first luminescent material that down-converts a first portion of the radiation emitted by the LEDs to radiation having a first peak wavelength that is in the green or yellow color ranges; a second luminescent material that down-converts a second portion of the radiation emitted by the LEDs to radiation having a second peak wavelength that is in the red color range, the second luminescent material having a full-width half maximum bandwidth of at least 70 nanometers; and a third narrowband luminescent material that down-converts a third portion of the radiation emitted by the LEDs to radiation having a plurality of distinct peaks in the red color range. The second peak wavelength may be within one of the two distinct peaks in the red color range generated by the third narrowband luminescent material that have the highest spectral emission.

The first luminescent material may be a YAG:Ce phosphor, the second luminescent material may be a $(Ca_{1-x}Sr_x)SiAlN_3:Eu^{2+}$ phosphor, and the third luminescent material may be a $K_2SiF_6:Mn^{4+}$ phosphor. The second luminescent material may be a $(Ca_{1-x}Sr_x)SiAlN_3:Eu^{2+}$ phosphor having a peak wavelength within one of the two highest spectral peaks of the $K_2SiF_6:Mn^{4+}$ phosphor (i.e., a peak wavelength between either 612 and 623 nm or between 630 and 640 nm). The emission spectrum of the semiconductor light emitting device may have a first peak that is attributable to the third luminescent material that is at least 50% greater than any point in the emission spectrum in the yellow or green color ranges.

Figure 16A:
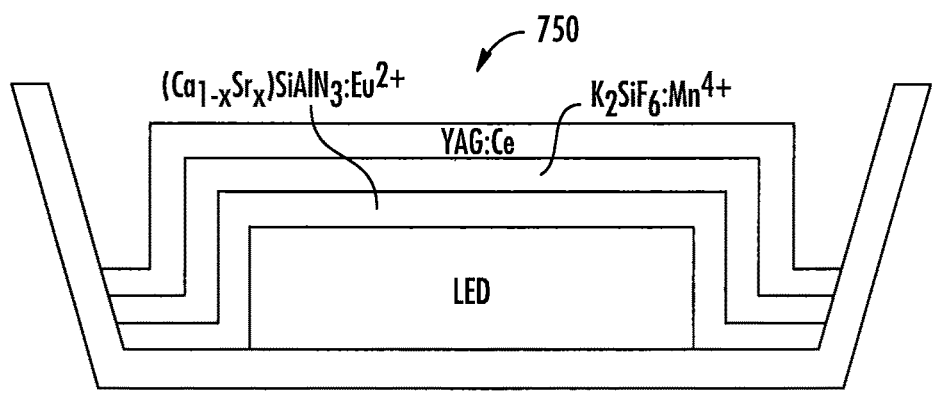
FIGS. 16A and 16B are schematic diagrams illustrating semiconductor light emitting devices according to further embodiments of the present invention.

An example semiconductor device 750 that may have either of the above configurations is illustrated in FIG. 16A. As shown in FIG. 16A, the recipient luminophoric medium may, for example, be sprayed onto the LED and also onto the reflector cup in a plurality of separate layers. In the depicted embodiment, the broadband red phosphor is the layer that is closest to the LED. A performance improvement may be obtained by having the broadband red phosphor closer to the LED than is the YAG:Ce phosphor. It will be appreciated, however, that the phosphor layers may be deposited in other orders (e.g., the narrowband red phosphor could be closest to the LED). Additionally, while the first through third luminescent materials are illustrated as being in separate layers in FIG. 16A, it will be appreciated that in other embodiments the first through third luminescent materials may be contained in fewer layers (e.g., a single layer) or more than three layers, and that the recipient luminophoric medium may or may not extend onto sidewalls of the LED and/or onto the reflector cup. The recipient luminophoric medium may, in some embodiments be conformally coated on the LED and the reflector cup. While a reflector cup is used as the mounting substrate in the embodiment of FIG. 16A, it will be appreciated that in other embodiments a submount, leadframe or other mounting surface may be used in place of the depicted reflector cup.

Figure 16B:
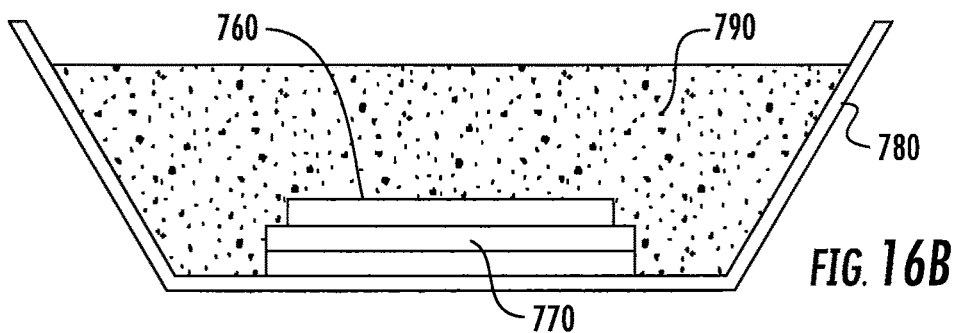

FIG. 16B illustrates another example implementation of the above described semiconductor light emitting device in which a blue LED 760 is mounted on a mounting substrate 770 and surrounded by a reflector cup 780, and the recipient luminophoric medium 790 is deposited on the LED within the reflector cup. The recipient luminophoric medium 790 may include all three luminescent materials mixed together. In still other embodiments, the recipient luminophoric medium may be coated onto the chip prior to packaging.

Figure 17A:
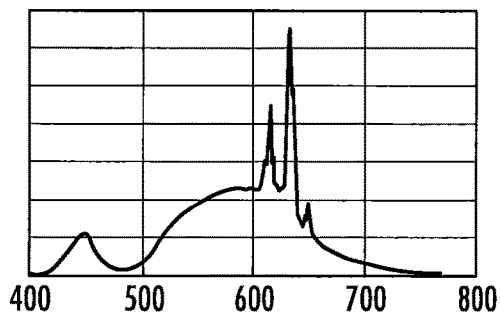
FIGS. 17A-17D are graphs that illustrate the emission spectra and color quality of a semiconductor light emitting device according to embodiments of the present invention (FIG. 17A) as compared to various other light emitting devices (FIGS. 17B-17D).
Figure 17B:
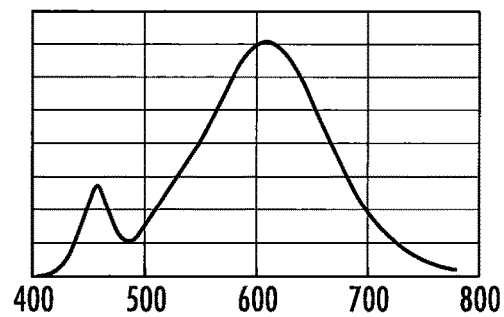
Figure 17C:
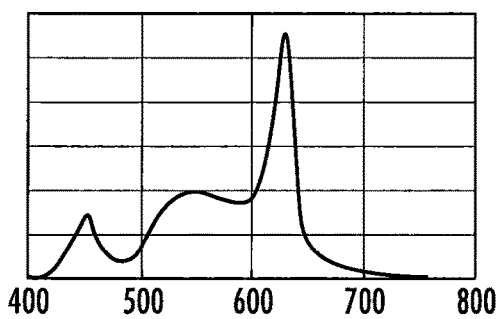
Figure 17D:
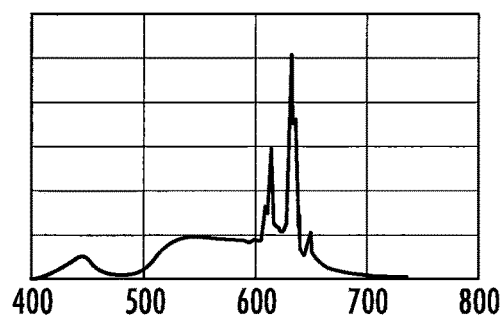

FIGS. 17A-17D illustrate the emission spectrum for a semiconductor light emitting device according to embodiments of the present invention (FIG. 17A) as compared to various other light emitting devices (FIGS. 17B-17D). Color rendering and color quality performance are also provided for each light source. FIG. 17A corresponds to the above-described semiconductor light emitting device that includes a blue LED, a YAG:Ce phosphor having a peak wavelength between 540 and 570 nm, a $(Ca_{1-x}Sr_x)SiAlN_3:Eu^{2+}$ phosphor having a peak wavelength between 610 and 630 nm, and a $K_2SiF_6:Mn^{4+}$ phosphor having a peak wavelength between 630 and 640 nm. The recipient luminophoric medium includes about 32% YAG:Ce phosphor, about 1% $(Ca_{1-x}Sr_x)SiAlN_3:Eu^{2+}$ phosphor and about 67% $K_2SiF_6:Mn^{4+}$ phosphor by weight. As shown in FIG. 17A, the emission spectra for this device has a small peak corresponding to the emission wavelength of the blue LED, a large, broad peak centered at about 585 nm that trails off more quickly at higher wavelengths, and a series of small narrow peaks extending from the large, broad peak in the red color range.

As is also shown in FIG. 17A, the light emitted by the device has a correlated color temperature of 2728 K, a CRI value of 82, a CRI R9 value of 34 and a Qg value of 101. While the CRI value may be somewhat lower than CRI values that are generally associated with very high quality white light, the high Qg value and the significant CRI R9 value indicate that the light source emits light that will be perceived as being very high quality for certain applications, such as applications where accurate rendering of red colored objects is important.

FIG. 17B illustrates the emission spectra for a conventional semiconductor light emitting device that includes a blue LED and a recipient luminophoric medium that includes a green or yellow phosphor and a broadband red phosphor. As can be seen, the emission spectra for this device has a conventional shape, and includes significant contributions falling at wavelengths above 650 nm, where the response of the human eye to such colored light is quite poor. This suggests that the light emitting device will not achieve good luminous flux performance as compared to the light emitting device associated with the emission spectra of FIG. 17A. A comparison of the performance data included in FIGS. 17A and 17B also shows that the light emitting device associated with the emission spectra of FIG. 17B generates lower quality light, having a slightly lower CRI value, a lower Qg value (95 versus 101 for the device of FIG. 17A) and a significantly lower CRI R9 value (15 versus 34 for the device of FIG. 17A).

FIG. 17C illustrates the emission spectra for a conventional semiconductor light emitting device that includes at least one blue-shifted yellow LED (i.e., a blue LED with an associated recipient luminophoric medium that includes a phosphor that emits yellow light) combined with at least one red light emitting LED, which is sometimes referred to as a "True White" light emitting device. As can be seen, the emission spectra for this device has the conventional shape for a blue-shifted yellow LED, along with a high peak in the red color range corresponding to the red LED. A comparison of the performance data included in FIGS. 17A and 17C also shows that the True White light emitting device generates high quality light having a CRI of 92, a very high CRI R9 of 96 and a Qg value of 108, although the True White light emitting device emits light at a higher correlated color temperature (3026 K) where it may be easier to exhibit improved color quality.

However, the semiconductor light emitting devices according to embodiments of the present invention may provide a number of advantages as compared to the True White light emitting device of FIG. 17C in terms of simplicity and cost. As noted above, the True White light emitting device uses both phosphor converted blue LEDs along with separate red LEDs, and hence the True White light emitting devices may require an optical mixing element and/or a mixing chamber to allow the light from the separate sources to mix to provide the white light output. The use of such mixing elements and/or chambers increases both the complexity and cost of the device. Moreover, in some applications, such as certain applications for the replacement of fluorescent lighting, the physical dimensions may make it difficult to perform the mixing required in approaches using multiple different color solid state lighting sources. Moreover, red LEDs are fabricated using different semiconductor materials than blue LEDs, and hence exhibit different thermal behavior. As one example, red LEDs tend to degrade in luminous efficiency more strongly than blue LEDs with increasing operating temperature. Thus, in order to generate light having consistent color characteristics as a function of temperature, circuitry may be required that increases the current supplied to the red LEDs with increasing temperature in order to maintain a consistent color point. This again increases the cost and complexity of the True White light emitting devices, and the reduced luminous efficiency of the red LEDs at elevated temperatures may degrade the luminous flux of the device. In contrast, the semiconductor light emitting devices according to embodiments of the present invention may not include mixing elements, mixing chambers, separate red LEDs and/or circuitry that increases the current supplied to the red LEDs with increasing temperature.

FIG. 17D illustrates the emission spectra for a semiconductor light emitting device that includes a blue LED and a recipient luminophoric medium that includes a YAG:Ce phosphor and a $K_2SiF_6:Mn^{4+}$ phosphor having a peak wavelength between 630 and 640 nm. The recipient luminophoric medium includes about 17% YAG:Ce phosphor and 83% $K_2SiF_6:Mn^{4+}$ phosphor by weight. As shown in FIG. 17D, the emission spectra for this device has a small peak corresponding to the emission wavelength of the blue LED, a large, broad peak centered at about 550 nm, and a series of small, high peaks extending from the large, broad peak in the red color range. A comparison of the performance data included in FIGS. 17A and 17D shows that the light emitting device associated with the emission spectra of FIG. 17D also generates high quality light having a CRI value of 90, CRI R9 value of 94, and a Qg value of 109. However, as the $K_2SiF_6:Mn^{4+}$ phosphor is more expensive than conventional red phosphors, and less potent, the light emitting device associated with the emission spectra of FIG. 17D may be very expensive to implement, and may be more difficult to make due to the sheer quantity of phosphor required.

By comparing FIGS. 17A and 17D, it can be seen that somewhat similar color rendering performance is provided by the two devices, with the device of FIG. 17D providing enhanced performance, but doing so at increased cost. The difference between these two devices is the percentage of the phosphors included in the luminophoric medium, with the device of FIG. 17A including about 65% of $K_2SiF_6:Mn^{4+}$ phosphor by weight, about 33% of YAG:Ce phosphor by weight and about 1-2% $(Ca_{1-x}Sr_x)SiAlN_3:Eu^{2+}$ phosphor by weight, while the device of FIG. 17D includes, about 83% of $K_2SiF_6:Mn^{4+}$ phosphor by weight, about 17% of YAG:Ce phosphor by weight and no $(Ca_{1-x}Sr_x)SiAlN_3:Eu^{2+}$ phosphor. It will be appreciated, however, that different ratios may be used. For example, in other embodiments, the recipient luminophoric medium may include between about 30% and 90% $K_2SiF_6:Mn^{4+}$ phosphor by weight, between about 0.5% and 10% of $(Ca_{1-x}Sr_x)SiAlN_3:Eu^{2+}$ phosphor by weight, and between about 15% and 60% YAG:Ce by weight. In other embodiments, the recipient luminophoric medium may include between about 50% and 75% $K_2SiF_6:Mn^{4+}$ phosphor by weight, between about 1% and 10% of $(Ca_{1-x}Sr_x)SiAlN_3:Eu^{2+}$ phosphor by weight, and between about 15% and 49% YAG:Ce by weight.

The ratio, by weight of the $K_2SiF_6:Mn^{4+}$ phosphor to the $(Ca_{1-x}Sr_x)SiAlN_3:Eu^{2+}$ phosphor may be at least 40:1 in some embodiments. In other embodiments this ratio may be at least 30:1. In still other embodiments this ratio may be at least 25:1. In still other embodiments this ratio may be at least 20:1. In yet further other embodiments this ratio may be at least 15:1.

As shown above, the semiconductor light emitting devices according to embodiments of the present invention may provide both good CRI values and high to very high CRI R9 values, while also providing very high overall color quality, and may do so while also providing high luminous flux values, which is a commercial necessity in many if not most applications. Meeting all of these criteria in a light emitting device that comprises a single LED chip with an associated recipient luminophoric medium may be a challenge, however, using conventional techniques.

Figure 18:
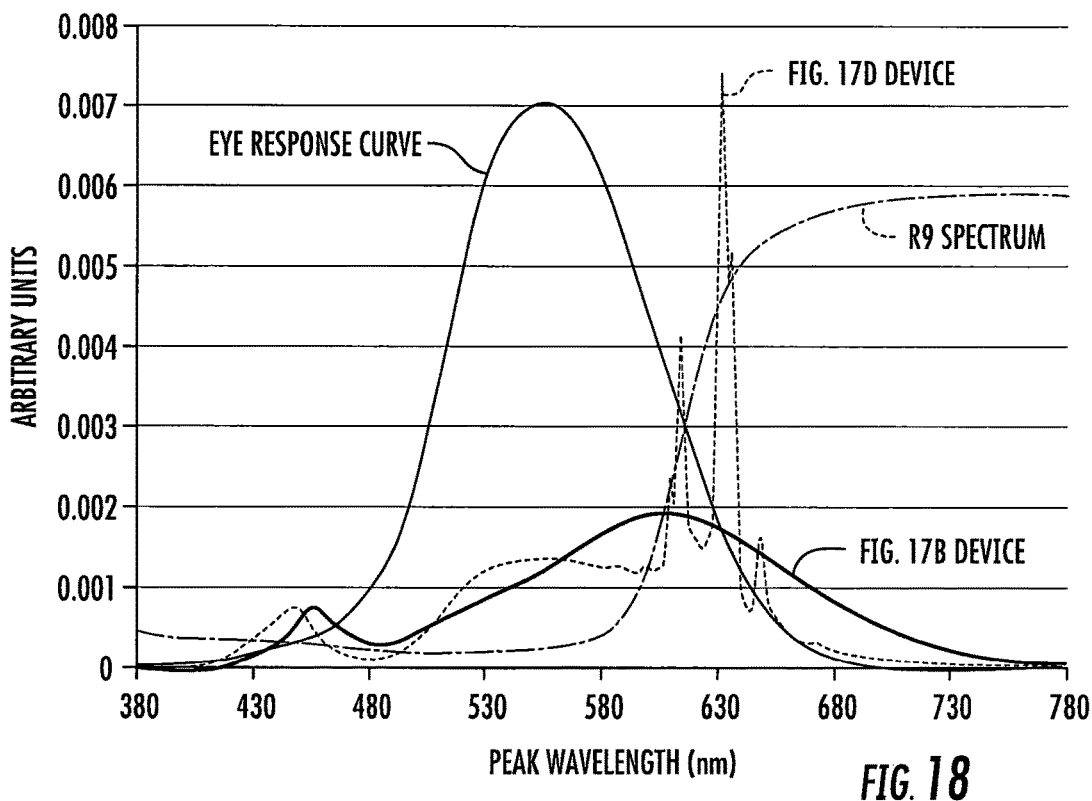
FIG. 18 is a plot of the emission spectra of FIGS. 17B and 17D, along with the eye response curve that illustrates the sensitivity of the human eye to light of various wavelengths and the CRI R9 reflectivity spectrum.

FIG. 18 is an emission spectra plot that helps illustrate this challenge. In particular, FIG. 18 plots the emission spectra for the semiconductor light emitting devices associated with FIGS. 17B and 17D above, along with the eye response curve that illustrates the sensitivity of the human eye to light of various wavelengths and the CRI R9 reflectivity spectrum. As can be seen in FIG. 18, the peaks in the eye response curve and the CRI R9 reflectivity spectrum have very little overlap, and it is only in a very tight wavelength range of about 615 to 635 nm that light provides significant contribution in terms of both luminous flux and CRI R9. Thus, to obtain a high CRI R9 value while also maintaining high luminous efficiency it may be necessary to concentrate the bulk of the red light emission spectrum in this narrow wavelength range.

As can be seen in FIG. 18, the emission spectrum for the conventional semiconductor light emitting device of FIG. 17B does not accomplish this, as there is a long emission tail in the red color range that extends beyond 635 nm where the eye has almost no sensitivity to the light, and hence the luminous efficiency of the device is reduced. Additionally, the wide emission bandwidth from the red phosphor used in this device does a poor job of concentrating energy in the wavelength range necessary to achieve high CRI R9 values, which is why this device will have a CRI R9 value of only about 15. Such a device will generally not do a good job of accurately rendering the color of red objects.

In contrast, the semiconductor light emitting device associated with FIG. 17D, which has a recipient luminophoric medium that includes a YAG:Ce phosphor (about 17% by weight) and a $K_2SiF_6:Mn^{4+}$ phosphor (about 83% by weight) concentrates almost all of the red emission in the 615-635 nm wavelength range where there is still reasonable eye sensitivity and good CRI R9 response. This semiconductor light emitting device may provide a CRI R9 value of about 94 while still maintaining high luminous efficiency.

Figure 19:
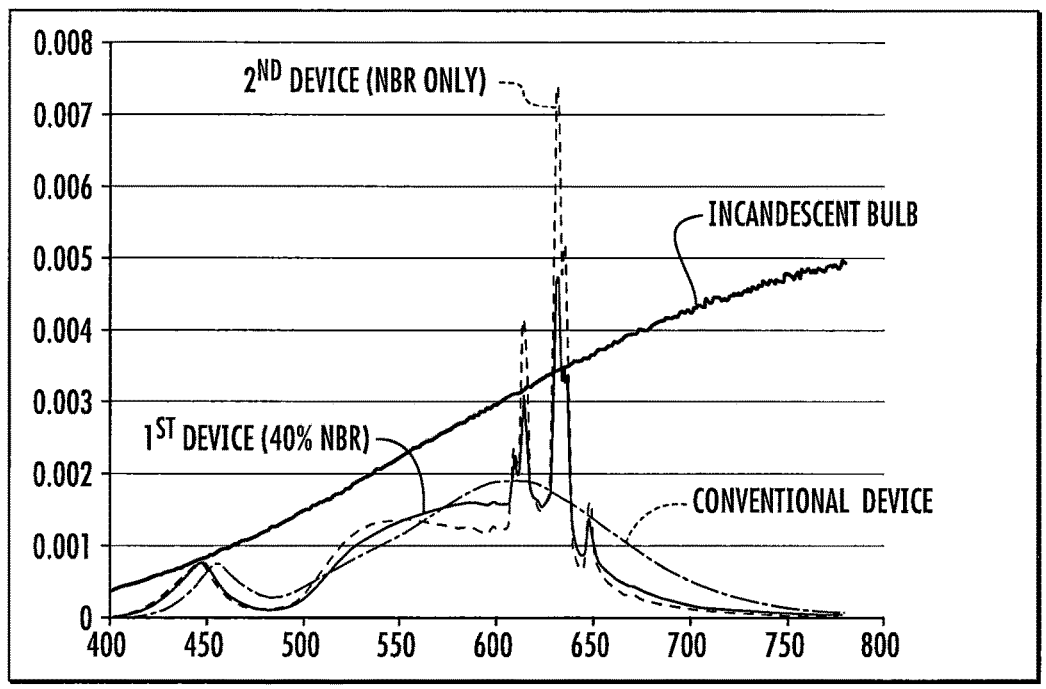
FIG. 19 is a graph of the emission spectra for a semiconductor light emitting device according to embodiments of the present invention as compared to a device that only includes a yellow phosphor and a narrowband red phosphor.

As discussed above, the semiconductor light emitting devices according to embodiments of the present invention may include a variety of ratios of a broadband red phosphor (e.g., a $(Ca_{1-x}Sr_x)SiAlN_3:Eu^{2+}$ phosphor) to a narrowband red phosphor (e.g., a $K_2SiF_6:Mn^{4+}$ phosphor). FIG. 19 compares the emission spectrum of two different semiconductor light emitting devices having two different ratios, namely a first device in which the narrowband red ("NBR") phosphor comprises about 40% of the total amount of phosphor by weight (which total includes the green/yellow phosphor), and which also includes a broadband red "(BBR") phosphor, and a second device that includes only the narrowband red phosphor (representing about 83% of the total amount of phosphor by weight). As can be seen in FIG. 19, the individual peaks associated with the narrowband red phosphor are only about half as high for the first device as compared to the second device, but the first device does exhibit increased emission in the 550-600 nm wavelength range, as well as increased emission at wavelengths above 650 nm. For comparative purposes, the emission spectra for an incandescent light bulb and for a conventional phosphor converted blue LED (e.g., the LED associated with FIG. 17B above) are plotted in FIG. 19 as well.

Figure 20A:
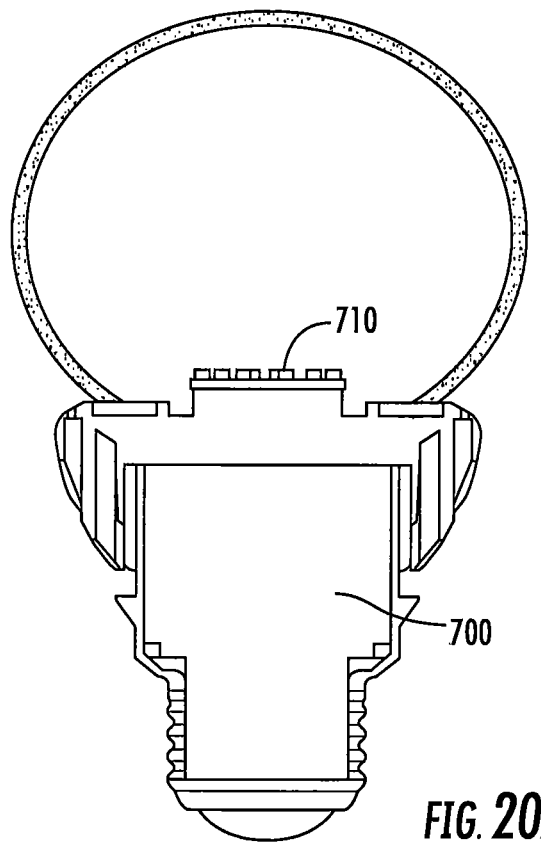
FIG. 20A is a schematic cross-sectional view of a light bulb that includes semiconductor light emitting devices according to embodiments of the present invention.
Figure 20B:
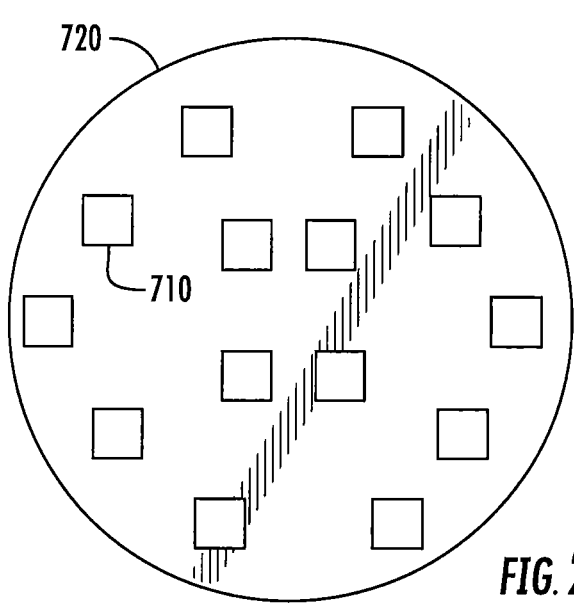
FIG. 20B is a schematic plan view of a mounting substrate included in the light bulb of FIG. 20A.

It will be appreciated that the semiconductor light emitting devices of FIG. 16A-16B can be used in a wide variety of packages to provide components and/or in bulbs or fixtures to provide lighting devices. For example, FIG. 20A is a schematic a schematic cross-sectional view of a light bulb 700 that includes semiconductor light emitting devices 710 according to embodiments of the present invention. FIG. 20B is a schematic plan view of a mounting substrate 720 that is included in the light bulb 700 of FIG. 20A. The mounting substrate 720 includes a plurality of the semiconductor light emitting devices according to embodiments of the present invention mounted thereon.

It will also be appreciated that additional phosphors may be included in the recipient luminophoric medium of the LEDs shown in FIGS. 16A, 16B and 20. For example, a portion of the YAG:Ce phosphor may be replaced with a LuAG:Ce phosphor. This will typically result in a decrease in the luminous flux performance of the device and an increase in the CRI value of the device. As another example, some of the $(Ca_{1-x}Sr_x)SiAlN_3:Eu^{2+}$ phosphor may be replaced with a higher peak wavelength $(Ca_{1-x}Sr_x)SiAlN_3:Eu^{2+}$ phosphor as is done in other embodiments of the present invention that are discussed above.

In some embodiments, the blue LEDs that are used may be a relatively short wavelength blue LEDs having a wavelength of 455 nm or less. The use of shorter wavelength blue LEDs may help achieve higher Qg values. However, at very low blue wavelengths, reliability may decrease as will the efficiency of the emission from the LED in exciting the YAG:Ce phosphor. Accordingly, in some embodiments, blue LEDs having peak wavelengths in the range of about 445 nm to about 455 nm may be preferred.

The above-described semiconductor light emitting devices according to embodiments of the present invention may exhibit high luminous flux, high quality color rendering, a good ability to accurately reproduce red colors, and overall high color quality and vividness. These semiconductor light emitting devices may be incorporated into components, bulbs and/or fixtures that do not include any red light emitting LEDs.

The above-described semiconductor light emitting devices having recipient luminophoric mediums that include a yellow phosphor, a broad-spectrum red phosphor and a narrow-spectrum red phosphor may be preferred over the semiconductor light emitting devices having two broad-spectrum red phosphors, a narrow-spectrum red phosphor and a green phosphor in some applications. In these devices, the peak wavelength of the broad-spectrum red phosphor and the peak-wavelength of the narrow-spectrum red phosphor may be very close together, which is non-intuitive as it tends to bunch the spectral combination of the two red phosphors in a narrow range as opposed to filling in gaps between the peak wavelengths for various phosphors. The omission of the second broad-spectrum red phosphor may generally (but not necessarily always) act to reduce the CRI of the device, but tends to increase the luminous efficiency of the device as the broad-spectrum red phosphor that is omitted is the one with the higher peak wavelength.

In some embodiments, the narrow-spectrum red phosphor may comprise a $K_2SiF_6:Mn^{4+}$ phosphor that has an emission spectrum with multiple distinct peaks, all of which are in the red color range. The highest of these peaks is at about 635 nm, and the second highest of these peaks is at about 615 nm. As discussed above, in some embodiments, the broad-spectrum red phosphor that is included in the recipient luminophoric medium may have a peak wavelength that is in between these two peaks (e.g., a peak wavelength between 615 and 635 nm). In other embodiments, the broad-spectrum red phosphor that is included in the recipient luminophoric medium may have a peak wavelength that is within one of these two peaks (i.e., a peak wavelength between about 612 and 623 or between about 630 and 640 nm). These are non-intuitive approaches, as they act to group the two red phosphors in the same portion of the emission spectrum as opposed to spreading the emission peaks of the phosphors out to fill in gaps in the emission spectrum for the device.

A tradeoff may exist based on the amount of red phosphors versus the amounts of yellow and/or green phosphors included in the recipient luminophoric mediums of semiconductor light emitting devices according to certain embodiments of the present invention. In particular, increasing the relative amount of red phosphor may generally improve the R9 and Qg performance of the device, and may also provide some improvement to the overall CRI of the device. Thus, increasing the relative amount of red phosphor (up to a certain point) may generally correspond to increased color quality. However, this typically comes at the cost of a decrease in the luminous flux of the device. For example, TABLE 2 compares the luminous flux and color quality performance of four example semiconductor light emitting devices according to embodiments of the present invention. The above-described tradeoff between color quality and luminous flux may clearly be seen in the data presented in TABLE 2.

TABLE 2

| Phosphor Combination | CCT (K) | Relative Luminous Flux | CRI | R9 | Qg | NBR % of Red Phosphor (Weight) | NBR % of Total Phosphor (Weight) |
|---|---|---|---|---|---|---|---|
| YAG + BBR + NBR | 2700 | 107 | 82 | 5 | 91 | 0.76 | 0.33 |
| YAG + LuAG + BBR + NBR | 2700 | 105 | 83 | 30 | 100 | 0.94 | 0.63 |
| YAG + BBR + NBR | 2700 | 106 | 85 | 50 | 105 | 0.98 | 0.74 |
| YAG + NBR | 2700 | 102 | 90 | 92 | 111 | 1.00 | 0.83 |
| Conventional Device 1 | 2700 | 100 | 81 | 5 | 95 | 0 | 0 |
| Conventional Device 2 | 2700 | 83 | 91 | 55 | 101 | 0 | 0 |

In TABLE 2, "YAG" refers to a YAG:Ce phosphor, "LuAG" refers to a LuAG:Ce phosphor, "BBR" refers to a broadband red phosphor, which in this case was a $(Ca_{1-x}Sr_x)SiAlN_3:Eu^{2+}$ phosphor, and "NBR" refers to a narrowband red phosphor, which in this case was a $K_2SiF_6:Mn^{4+}$ phosphor. "CCT" stands for correlated color temperature, and the last two columns of TABLE 2 show the percentage, by weight, that the narrowband red phosphor made up of the total amount of red phosphor and the percentage, by weight, that the narrowband red phosphor made up of the total amount of phosphor, respectively. The general trend toward increased color quality at the cost of a reduction in luminous flux that is discussed above can be seen in the data in TABLE 2.

Figure 21A:
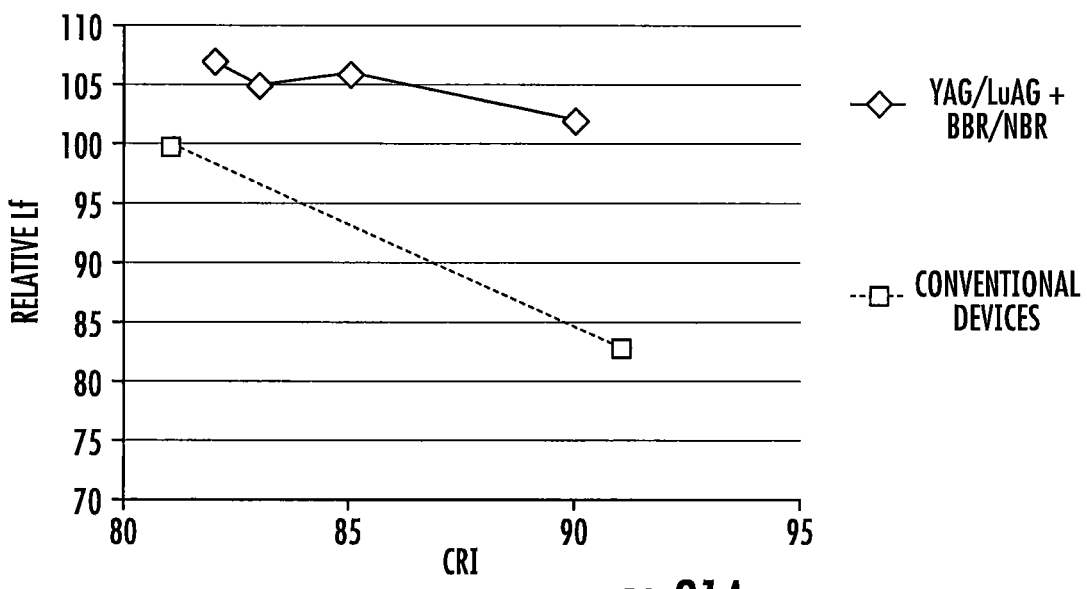
FIGS. 21A and 21B are graphs illustrating the tradeoff between color quality and luminous flux in conventional devices as well as in semiconductor light emitting devices according to embodiments of the present invention.
Figure 21B:
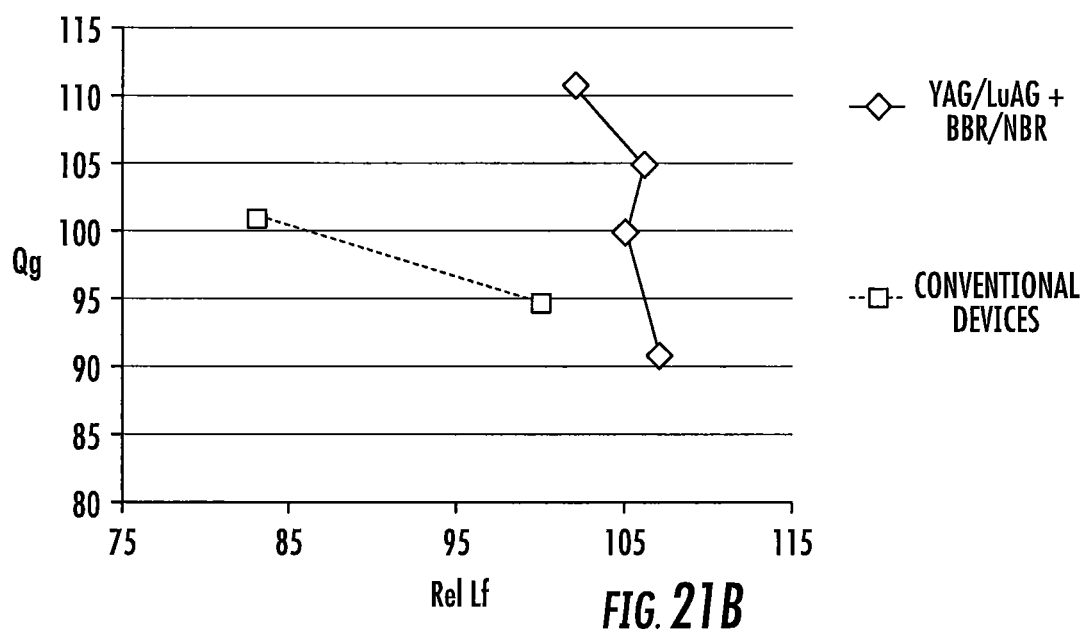

For comparative purposes, performance data is also provided in TABLE 2 for two conventional state of the art semiconductor light emitting devices labeled "Conventional Device 1" and "Conventional Device 2." As is readily apparent, these devices generally exhibit worse performance in terms of both color quality and luminous flux as compared to the semiconductor light emitting devices according to embodiments of the present invention. FIGS. 21A and 21B are graphs of CRI and Qg versus luminous flux, respectively that illustrate the data presented in TABLE 2 above. These graphs clearly show the improved performance provided by the semiconductor light emitting devices according to embodiments of the present invention as well as the tradeoff between luminous flux and color quality performance.

In some embodiments, the amounts of the YAG:Ce, LuAG:Ce, broadband red and narrowband red phosphors may be varied to achieve different levels of color quality, luminous flux and cost performance. In a first such embodiment, a LuAG:Ce phosphor may comprise about 60-70% of the total amount of phosphor by weight, a narrowband red phosphor may comprise about 20-30% of the total amount of phosphor by weight, and a broadband red phosphor may comprise about 10-20% of the total amount of phosphor by weight. In such embodiments, the LuAG:Ce phosphor may have a peak wavelength between about 535 and 550 nm, the narrowband red phosphor may have a peak wavelength between about 625 and 635 nm, and the broadband red phosphor may have a peak wavelength between 610 and 630 nm or, more preferably, between 612 and 625 nm.

In a second such embodiment, a LuAG:Ce phosphor may comprise about 5-15% of the total amount of phosphor by weight, a YAG:Ce phosphor may comprise about 15-30% of total amount of phosphor by weight, a narrowband red phosphor may comprise about 60-70% of the total amount of phosphor by weight, and a broadband red phosphor may comprise about 2-10% of the total amount of phosphor by weight. In such embodiments, the LuAG:Ce phosphor may have a peak wavelength between about 535 and 550 nm, the YAG:Ce phosphor may have a peak wavelength between about 550 and 560 nm, the narrowband red phosphor may have a peak wavelength between about 625 and 635 nm, and the broadband red phosphor may have a peak wavelength between 610 and 630 nm or, more preferably, between 612 and 625 nm.

In a third such embodiment, a YAG:Ce phosphor may comprise about 20-30% of the total amount of phosphor by weight, a narrowband red phosphor may comprise about 70-80% of the total amount of phosphor by weight, and a broadband red phosphor may comprise about 2-8% of the total amount of phosphor by weight. In such embodiments, the YAG:Ce phosphor may have a peak wavelength between about 550 and 560 nm, the narrowband red phosphor may have a peak wavelength between about 625 and 635 nm, and the broadband red phosphor may have a peak wavelength between 610 and 630 nm or, more preferably, between 612 and 625 nm.

The second and third embodiments discussed above could also be modified to have less of the broadband red phosphor by weight. For example, the lower limit on the percentage of the broadband red phosphor by weight may be reduced from 2% to 1% or even to 0.5% in further embodiments.

In each of the above embodiments, the recipient luminophoric medium may be used with a blue LED having a peak wavelength of, for example, between 450 and 455 nm.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

For example, a wide variety of semiconductor light emitting devices are described above that include a blue LED having an associated recipient luminophoric medium that includes at least a broadband green and/or yellow light emitting luminescent material (e.g., a YAG:Ce or LuAG:Ce phosphor), at least one broadband red light emitting luminescent material (e.g., a $(Ca_{1-x}Sr_x)SiAlN_3:Eu^{2+}$ phosphor) and a narrowband red light emitting luminescent material (e.g., a $K_2SiF_6:Mn^{4+}$ phosphor). It will be appreciated that the recipient luminophoric mediums for these semiconductor light emitting devices may be deposited on the blue LEDs using any of the techniques described herein, and that the recipient luminophoric mediums may have any of the different configurations discussed herein in term of the portion of the LED that they cover and the particular layer structure (e.g., a single layer recipient luminophoric medium or a multi-layer recipient luminophoric medium). Likewise, these semiconductor light emitting devices may comprise individual LEDs, packaged components including one or more of the LEDs, and/or light fixtures or light bulbs. For example, any of the semiconductor light emitting devices disclosed herein could be used in as the light emitting devices in the packaged components, fixtures and light bulbs of FIGS. 9, 10 and 20.

The present invention has been described above with reference to the accompanying drawings, in which certain embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that, when used in this specification, the terms "comprises" and/or "including" and derivatives thereof, specify the presence of stated features, operations, elements, and/or components, but do not preclude the presence or addition of one or more other features, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions and/or layers, these elements, components, regions and/or layers should not be limited by these terms. These terms are only used to distinguish one element, component, region or layer from another element, component, region or layer. Thus, a first element, component, region or layer discussed below could be termed a second element, component, region or layer without departing from the teachings of the present invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of manufacturing a semiconductor light emitting device, comprising:
    synthesizing a narrow-spectrum phosphor by:
        dissolving $MO_2$ powder in a first hydrofluoric acid (HF) solution to provide an $MO_2$+HF solution, where M is one or more of Si, Ge, Sn, Ti, Zr or Hf;
        adding $A_2MnF_6$ to the $MO_2$+HF solution to provide a $A_2MnF_6$+$MO_2$+HF solution, where A is an Alkali metal;
        dissolving $AHF_2$ in a second hydrofluoric acid solution to provide an $AHF_2$+HF solution;
        adding the $AHF_2$+HF solution to the $A_2MnF_6$+$MO_2$+HF solution;
        extracting solid precipitates of $A_2MF_6$:$Mn^{4+}$ from the combination of the $AHF_2$+HF and the $A_2MnF_6$+$MO_2$+HF solutions;
    providing a light emitting diode ("LED"); and
    providing a recipient luminophoric medium that is configured to down-convert at least some of the light emitted by the LED, the recipient luminophoric medium including:
        a first luminescent material that down-converts a first portion of the radiation emitted by the LED to radiation having a first peak wavelength in the green color range;
        a second luminescent material that down-converts a second portion of the radiation emitted by the LED to radiation having a second peak wavelength in the red color range, the second luminescent material having a full-width half maximum bandwidth of at least 70 nanometers;
        a third luminescent material that down-converts a third portion of the radiation emitted by the LED to radiation having a third peak wavelength in the red color range; and
        a fourth luminescent material that includes the narrow-spectrum phosphor $A_2MF_6$:$Mn^{4+}$ precipitates, the fourth luminescent material configured to down-convert a fourth portion of the radiation emitted by the LED to radiation having a fourth peak wavelength in the red color range.

2. The method of claim 1, wherein M is silicon (Si) and A is potassium (K).

3. The method of claim 1, wherein the $AHF_2$+HF solution is added to the $A_2MnF_6$+$MO_2$+HF solution at a temperature between 40° C. and 90° C.

4. The method of claim 1, wherein the fourth peak wavelength is greater than the second peak wavelength and less than the third peak wavelength.

5. The method of claim 1, wherein the second peak wavelength is within 30 nanometers of the third peak wavelength.

6. The method of claim 1, wherein an emission spectrum of the semiconductor light emitting device includes a first peak at the fourth peak wavelength that is at least 50% greater than any point in the emission spectrum in the yellow or green color ranges.

7. The method of claim 1, further comprising:
    adding the solid precipitates of $A_2MF_6$:$Mn^{4+}$ to a saturated $A^+$+$M^{4+}$+HF solution;
    adding an AF+HF solution to the $A^+$+$M^{4+}$+HF solution that includes the solid precipitates of $A_2MF_6$:$Mn^{4+}$; and
    extracting solid precipitates of $A_2MF_6$:$Mn^{4+}$ having an $A_2MF_6$ coating thereon from the combined AF+HF solution and $A^+$+$M^{4+}$+HF solution that includes the solid precipitates of $A_2MF_6$:$Mn^{4+}$.

8. A method of manufacturing a semiconductor light emitting device, comprising:
    synthesizing a narrow-spectrum phosphor by:
        dissolving $MO_2$ powder in a first hydrofluoric acid (HF) solution to provide an $MO_2$+HF solution, where M is one or more of Si, Ge, Sn, Ti, Zr or Hf;
        adding $A_2MnF_6$ to the $MO_2$+HF solution to provide an $A_2MnF_6$ solution, where A is an alkali metal;
        adding a compound comprising fluorine and the alkali metal to a second hydrofluoric acid solution to provide an alkali metal/HF solution;
        adding the $A_2MnF_6$ solution to the alkali metal/HF solution; and
        extracting a solid precipitate of $A_2MF_6$:$Mn^{4+}$ from the combination of the alkali metal/HF solution and the $A_2MnF_6$ solution;
    providing a light emitting diode ("LED"); and
    providing a recipient luminophoric medium that is configured to down-convert at least some of the light emitted by the LED, the recipient luminophoric medium including:
        a first luminescent material that down-converts a first portion of the radiation emitted by the LED to radiation having a first peak wavelength in the green color range;
        a second luminescent material that down-converts a second portion of the radiation emitted by the LED to radiation having a second peak wavelength in the red color range, the second luminescent material having a full-width half maximum bandwidth of at least 70 nanometers; and
        a third luminescent material that includes the narrow-spectrum phosphor $A_2MF_6$:$Mn^{4+}$ precipitates, the third luminescent material configured to down-convert a third portion of the radiation emitted by the LED to radiation having a third peak wavelength in the red color range.

9. The method of claim 8, wherein an emission spectrum of the semiconductor light emitting device includes a first peak at the third peak wavelength that is at least 50% greater than any point in the emission spectrum in the yellow or green color ranges.

10. The method of claim 8, wherein the $A_2MnF_6$ solution is added to the alkali metal/HF solution at a temperature between 40° C. and 90° C.

11. The method of claim 8, further comprising:
    adding the solid precipitates of $A_2MF_6$:$Mn^{4+}$ to a saturated $A^+$+$M^{4+}$+HF solution;
    adding an AF+HF solution to the $A^+$+$M^{4+}$+HF solution that includes the solid precipitates of $A_2MF_6$:$Mn^{4+}$; and
    extracting solid precipitates of $A_2MF_6$:$Mn^{4+}$ having an $A_2MF_6$ coating thereon from the combined AF+HF solution and $A^+$+$M^{4+}$+HF solution that includes the solid precipitates of $A_2MF_6$:$Mn^{4+}$.

12. The method of claim 8, wherein adding the $A_2MnF_6$ solution to the alkali metal/HF solution comprises adding the $A_2MnF_6$ solution to the alkali metal/HF solution in a dropwise fashion.

13. The method of claim 8, wherein adding the $A_2MnF_6$ solution to the alkali metal/HF solution comprises adding the alkali metal/HF solution to the $A_2MnF_6$ solution in a dropwise fashion.

14. The method of claim 8, wherein M is silicon (Si) and A is potassium (K).

15. A method of manufacturing a semiconductor light emitting device, comprising:
    synthesizing a narrow-spectrum phosphor by:

dissolving SiO$_2$ powder in a first hydrofluoric acid (HF) solution to provide a SiO$_2$+HF solution;

adding K$_2$MnF$_6$ to the SiO$_2$+HF solution to provide a K$_2$MnF$_6$ solution;

adding a compound comprising fluorine and potassium (K) to a second hydrofluoric acid solution to provide a potassium/HF solution;

adding the K$_2$MnF$_6$ solution to the potassium/HF solution; and extracting a solid precipitate of K$_2$SiF$_6$:Mn$^{4+}$ from the combination of the potassium/HF solution and the K$_2$MnF$_6$ solution;

providing a light emitting diode ("LED"); and providing a recipient luminophoric medium that is configured to down-convert at least some of the light emitted by the LED, the recipient luminophoric medium including:

a first luminescent material that down-converts a first portion of the radiation emitted by the LED to radiation having a first peak wavelength in the green color range;

a second luminescent material that down-converts a second portion of the radiation emitted by the LED to radiation having a second peak wavelength in the red color range, the second luminescent material having a full-width half maximum bandwidth of at least 70 nanometers; and a third luminescent material that includes the narrow-spectrum phosphor K$_2$SiF$_6$:Mn$^{4+}$ precipitates, the third luminescent material configured to down-convert a fourth portion of the radiation emitted by the LED to radiation having a third peak wavelength in the red color range.

16. The method of claim 15, wherein an emission spectrum of the semiconductor light emitting device includes a first peak at the third peak wavelength that is at least 50% greater than any point in the emission spectrum in the yellow or green color ranges.

17. The method of claim 15, wherein the K$_2$MnF$_6$ solution is added to the potassium/HF solution at a temperature between 40° C. and 90° C.

18. The method of claim 15, further comprising:

adding the solid precipitates of K$_2$SiF$_6$:Mn$^{4+}$ to a saturated K$^+$+Si$^{4+}$+HF solution;

adding a KF+HF solution to the K$^+$+Si$^{4+}$+HF solution that includes the solid precipitates of K$_2$SiF$_6$:Mn$^{4+}$; and extracting solid precipitates of K$_2$SiF$_6$:Mn$^{4+}$ having a K$_2$SiF$_6$ coating thereon from the combined KF+HF solution and K$^+$+Si$^{4+}$+HF solution that includes the solid precipitates of K$_2$SiF$_6$:Mn$^{4+}$.

19. The method of claim 15, wherein adding the K$_2$MnF$_6$ solution to the potassium/HF solution comprises adding the K$_2$MnF$_6$ solution to the potassium/HF solution in a dropwise fashion.

20. The method of claim 15, wherein adding the K$_2$MnF$_6$ solution to the potassium/HF solution comprises adding the potassium/HF solution to the K$_2$MnF$_6$ solution in a dropwise fashion.

* * * * *